United States Patent [19]

Iadanza et al.

[11] Patent Number: 5,802,003
[45] Date of Patent: Sep. 1, 1998

[54] SYSTEM FOR IMPLEMENTING WRITE, INITIALIZATION, AND RESET IN A MEMORY ARRAY USING A SINGLE CELL WRITE PORT

[75] Inventors: Joseph Andrew Iadanza, Hinesburg; Frank Ray Keyser, III, Colchester; Ralph David Kilmoyer; Michael Joseph Laramie, both of Essex Jct., all of Vt.

[73] Assignee: International Business Machines Corporation, Armonk, N.Y.

[21] Appl. No.: 575,422

[22] Filed: Dec. 20, 1995

[51] Int. Cl.[6] .................... G11C 7/00; G11C 8/00
[52] U.S. Cl. .................. 365/230.03; 365/230.01; 365/230.05; 365/189.08
[58] Field of Search ............... 365/230.01, 189.01, 365/230.03, 230.05, 189.08

[56] References Cited

U.S. PATENT DOCUMENTS

| | | | |
|---|---|---|---|
| 4,430,712 | 2/1984 | Coulson et al. | 364/300 |
| 4,435,775 | 3/1984 | Brantingham et al. | 364/900 |
| 4,694,433 | 9/1987 | Wiedman | 365/230 |
| 4,775,942 | 10/1988 | Ferreri et al. | 364/491 |
| 4,969,148 | 11/1990 | Nadean-Dostie et al. | 371/21.1 |
| 5,121,355 | 6/1992 | Gubbels et al. | 365/200 |
| 5,278,956 | 1/1994 | Thomsen et al. | 395/250 |
| 5,341,382 | 8/1994 | Levitt | 371/22.1 |
| 5,345,419 | 9/1994 | Fenstermaker et al. | 365/189.04 |
| 5,375,089 | 12/1994 | Lo | 365/189.04 |
| 5,398,211 | 3/1995 | Willenz et al. | 365/230.05 |
| 5,434,406 | 7/1995 | Freeman et al. | 364/490 |

*Primary Examiner*—Viet Q. Nguyen
*Attorney, Agent, or Firm*—Heslin & Rothenberg, P.C.

[57] ABSTRACT

A system is provided for providing functional, initialization and reset access to a plurality of memory cells of a memory array, using a single cell write port and a single cell read port. In addition to functional address and data buses, initialization address and data buses are provided. The invention is disclosed in association with a field-programmable memory array having multiple sub-arrays therein. The address units for each sub-array are provided to programmably provide address information to the wordlines of each sub-array from an initialization address bus or a functional address bus. Similarly, readhead and writehead circuits within each sub-array are also programmable to propagate data between initialization or functional data buses and the memory cells of the sub-array. The address units, readheads, and writeheads are all responsive to a dominant reset signal to reset the associated cells. An initialization select bus is disclosed for selecting a given sub-array of the multiple sub-arrays for the initialization function. A programming or configuration system for the field-programmable memory array is disclosed with additional units for operating the address and data buses, address units, readheads, writeheads, and the initialization buses.

38 Claims, 16 Drawing Sheets

ASSEMBLE FIG. 4 AS FOLLOWS:

5,802,003

SYSTEM FOR IMPLEMENTING WRITE, INITIALIZATION, AND RESET IN A MEMORY ARRAY USING A SINGLE CELL WRITE PORT

RELATED APPLICATION INFORMATION

This application relates to commonly owned, concurrently or previously filed U.S. patent applications:

1. Ser. No. 08/572,312, Docket No. FI9-95-077, filed Dec. 20, 1995 entitled "FIELD PROGRAMMABLE MEMORY ARRAY," and hereinafter referred to as the "FPMA Application;" and 2. Ser. No. 08/577,177, Docket No. FI9-95-138, filed Dec. 20, 1995 entitled "PROGRAMMABLE PARITY CHECKING AND COMPARISON CIRCUIT."

Each of these applications is hereby incorporated by reference herein in its entirety.

TECHNICAL FIELD

This invention relates to digital memory systems. More particularly, this invention relates to a memory system for which programmable access from multiple address and data sources, and asynchronous reset, are provided.

BACKGROUND OF THE INVENTION

As Field-Programmable Gate Array (FPGA) device densities increase above 10,000 gates and compete with ASIC densities common in previous 1.5 um and 1.2 um technologies, the need for providing on-chip storage resources capable of providing RAM, ROM, LIFO, FIFO or cache function is increasing. In recognition of this need, FPGA products with dense storage capability having varied designs have been proposed, for example, in the above incorporated FPMA Application.

In addition to the design elements found in storage arrays common in both custom and ASIC design, a memory array structure designed for embedding within an FPGA may provide on-the-fly reconfiguration ability driven by a configuration data bitstream. Such an array may also contain a means of accessing the actual array storage devices from the FPGA configuration state machine in order to implement virtual ROS (Read Only Store) capability, or the ability to restore or poll array data during engineering debug, reconfiguration, etc.

The ability to reset the memory array, not often associated with custom and ASIC arrays, but common in small 1×N registers, may also be a requirement due to the run time reconfiguration capabilities of FPGAs. A memory cell is proposed in the aboveincorporated FPMA Application in which three unique write ports to the memory cell, and some amount of control logic to prevent contention between the different ports, are provided. Although functionally viable, this implementation requires multiple write ports per cell, with associated wiring and control for each port. Additionally, configuration bitstream generation methodology for the memory array may be impacted due to integration of the FPGA function/routing configuration data and the memory array initialization data.

What is required is a system for accessing a memory array from varying address and data sources (e.g., functional, initialization, reset, etc.) in a space efficient manner, with as little excess hardware as possible, and without contention problems. Such a system should also accommodate potentially differing widths of a memory array word and a configuration bitstream word, if the configuration bitstream is to be used for memory array initialization.

SUMMARY OF THE INVENTION

Briefly described, the present invention, in one aspect, is a memory array having a plurality of memory cells and including a primary (e.g., functional) address bus for carrying primary address information for accessing at least a portion of the memory cells. A secondary (e.g., initialization) address bus is also provided for carrying secondary address information for accessing the portion of the memory cells. A programmable selection circuit is disposed between the primary address bus, the secondary address bus and the portion of memory cells, the selection circuit being programmable to propagate address information from either the primary address bus or the secondary address bus to the portion of memory cells.

The portion of memory cells is accessed using a plurality of wordlines, and a wordline generator system is disposed between the programmable selection circuit and the plurality of wordlines, the primary or secondary address information being programmably propagated to the wordline generator system from the selection circuit. The wordline generator may further include a reset circuit connected therein such that each of the plurality of wordlines is asserted by the wordline generator upon receipt of a reset signal.

The portion of memory cells is also accessed using a plurality of bitlines, and the memory array includes a primary data bus and a secondary data bus. A plurality of programmable write circuits is provided, each disposed between the primary data bus, the secondary data bus, and a respective bitline of the plurality of bitlines. Each write circuit is programmable to propagate data to a respective bitline from either the primary data bus or the secondary data bus. Each programmable write circuit may further include a reset circuit connected therein, such that the respective bitline is set to a reset voltage level upon receipt of a reset signal.

The memory array may further include a programmable read circuit associated with each respective read bitline of the plurality of bitlines, each read circuit being programmable to propagate data from its respective read bitline to the primary data bus and/or the secondary data bus.

In another aspect of the invention, a programming or configuration system associated with the memory array is provided, and includes an address space recognition unit, an array select unit, an address counter unit, a memory array data port, and an array control signal generation unit, for operating the primary, secondary and reset signal sources.

A programmable gate array may be provided having a memory array formed as set forth above embedded therein. The programmable gate array may have a programming system for programming the gate array in association with the programming system of the memory array.

If the memory array of the present invention is used in association with a programmable gate array, a method and system are disclosed for operating the programmable gate array wherein the array of memory cells is accessible from the programmable gate array via functional address and data buses switchably connected to a set of wordlines and bitlines. The method includes using a configuration bitstream to configure configurable resources of the programmable gate array; and using the configuration bitstream to initialize the array of memory cells via initialization and address and data buses, the initialization address and data buses being switchably connected to the set of wordlines and bitlines.

A number of structures are thus disclosed to integrate the functional write, initialization, and reset functions into a single write port at cell level through modifications to the array writeheads, readheads, wordline generators, and address distribution systems, as well as the configuration state machine. The disclosed design simplifies integration of an FPMA into an FPGA while providing for both improved performance and density. Although primarily targeted for use within an FPMA, these techniques are useful in other designs in which asynchronous reset and priority initialization are required.

BRIEF DESCRIPTION OF THE DRAWINGS

This subject matter which is regarded as the invention is particularly pointed out and distinctly claimed in the concluding portion of the specification. The invention, however, both as to organization and method of practice, together with further aspects and advantages thereof, may best be understood by reference to the following description of preferred embodiment(s) and the accompanying drawings in which:

DETAILED DESCRIPTION OF THE PREFERRED EMBODIMENT (S)

Overview

Figure 1:
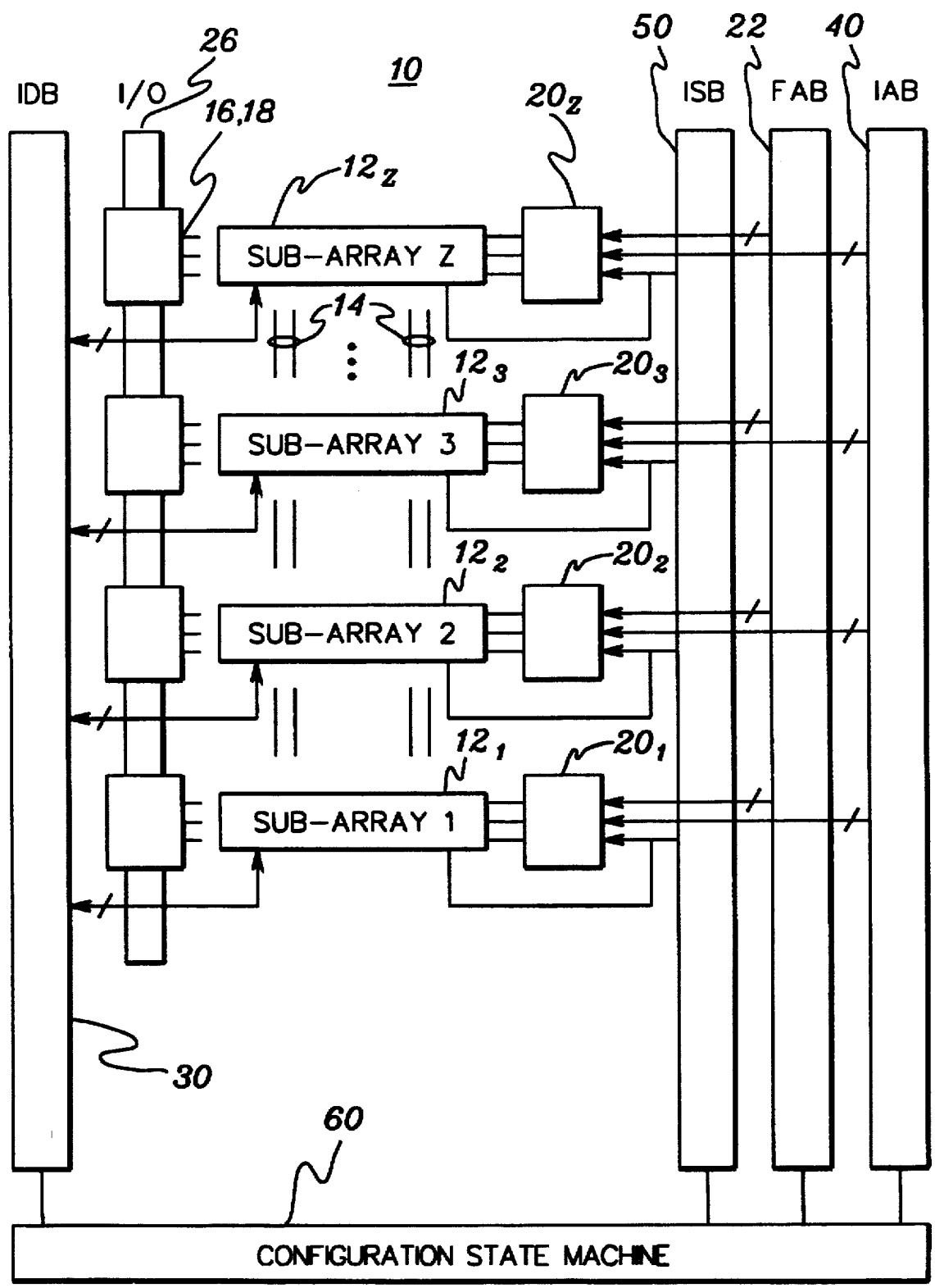
FIG. 1 is a block diagram of a field-programmable memory array constructed in accordance with the principles of the present invention.

As described in the incorporated FPMA Application, and as generally depicted in FIG. 1, an FPMA 10 may be made up of a number of memory sub-arrays 12 each of size M words×N bits, and each capable of implementing a 2 port (1 read/1 write) RAM. Sub-arrays may be logically and physically independent, or may be connected together using global bitline resources 14 within the FPMA. The global bitline resource is constructed of N hierarchical bitline bundles, where N is equivalent to the sub-array Nbit value. Each bundle provides a multiplicity of connection possibilities between a bit of the sub-array and the like-numbered bit of at least a subset of other sub-arrays present in the FPMA. Hierarchies of different lengths and loadings are provided within the bundles to both optimize timing for application RAM size and facilitate sub-array usage efficiency.

Ingress to the sub-array from any hierarchy of the bitline bundles (write port) is made via a multiplexer at the sub-array write circuit, or "writehead," (not shown) the multiplexer state being determined by configuration information. Read data egress from the sub-array read circuit, or "readhead," (not shown) to the chosen hierarchy of the read bitline bundles is made in a similar manner. Sub-array writeheads and readheads, alternatively referred to herein as data handling circuits, are discussed further below.

Each sub-array has associated therewith an address unit 20 capable of fully decoding the read address and write address normally provided from a functional address bus ("FAB") 22. The address unit 20 is comprised of a low-order unit (not shown) which is fixed in construction and which fully decodes the address space local to the sub-array; a high-order unit (not shown) which is configurable in nature and which allows sub-array selection using the most significant bits of the address presented; and a number of wordline generators (not shown), each of which serves a unique wordline for either the read or write ports of a row of cells. The wordline generator takes as input decoded address from the low-order and high-order units along with various control and clock signals required for wordline activation. Address and control routing to the sub-array is made by a number of address bundles similar in both nature and hierarchy to the bitline bundles described previously, which form the functional address bus 22.

Hierarchical selection from the address bundles is made via multiplexer circuitry (not shown) which is controlled by configuration information. The multiplexer circuitry between the address bundles and address unit 20 allows for stabilization of certain control signals such as write clock, read clock, write enable, reset, and high-order address bits to ensure stability and functionality for various applications of the FPMA.

As disclosed in the incorporated FPMA Application, an I/O bus 26 and associated I/O systems 16, 18 (I/O routing matrix, I/O blocks) are also provided between the bitline bundles 14 and an associated or external device (e.g., FPGA) for propagating data from the sub-arrays.

In accordance with the present invention, and as discussed further below, initialization data, address and select buses (30, 40, and 50; "IDB," "IAB," and "ISB") are provided in operative relationship with the sub-arrays 12 and the configuration state machine 60. Address units 20, and readhead and writehead circuits associated with each sub-array 12, are implemented to operate the array 10 functionally (via bus 22 and read and write bitlines 14), initialize the array (via bus 40 and bus 30), and reset the array, using only a single write port in each cell, in accordance with the invention, and as set forth in detail below.

The subject invention reduces the number of write ports required within each memory cell, thereby allowing a significant increase in density while simultaneously resolving potential contention and stabilization issues within the FPMA in an efficient manner.

Sub-Array

Figure 2:
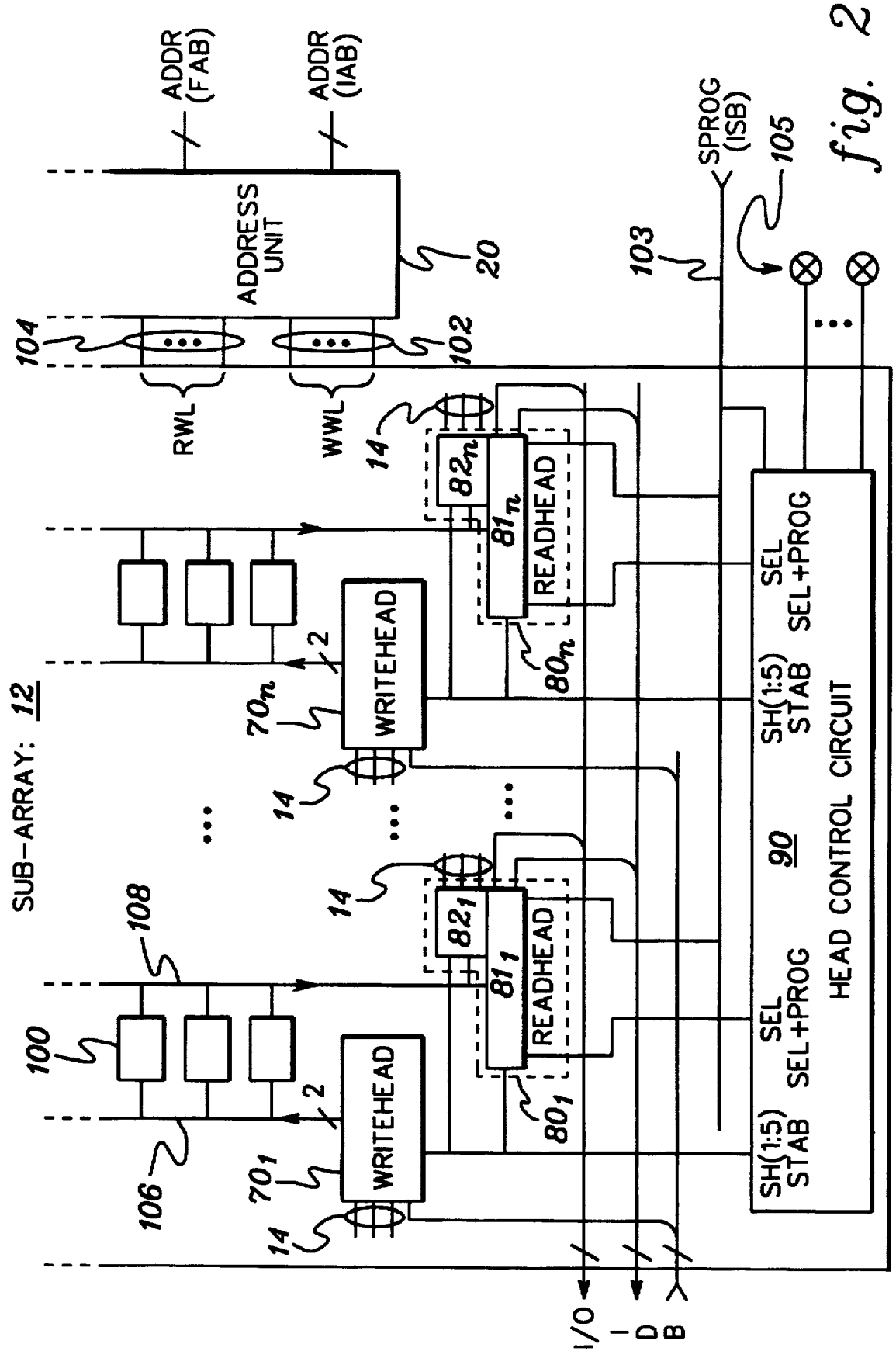
FIG. 2 is a block diagram of a sub-array of the memory array of FIG. 1.

FIG. 2, is a partial block diagram of one of the sub-arrays 12 of the memory array. A sub-array 12 consists of multiple memory cells, e.g., cell 100, with each column of cells having associated therewith write bitlines 106 and read bitlines 108. The address unit 20 is provided and, based on address information derived from either a functional address bus ("FAB") or an initialization address bus ("IAB") activates write wordlines 102 and read wordlines 104 to operate the cells of the sub-array. Each column of memory cells has associated therewith a respective writehead circuit 70, and a respective readhead circuit 80 for propagating data between the bitlines (106 and 108) associated with the column of memory cells and the higher level data propagation systems of the memory array, including bitline structures 14, or, alternatively, an initialization data bus ("IDB"). Readhead circuits 80 may include clock generator and capture latches 81, as well as selective switching 82, as discussed further below.

For each sub-array there is provided a head control circuit 90, which in response to configuration information 105 or information 103 derived from an initialization select bus ("ISB"), operates the readhead and writehead circuits. (The notation of a circle with an X therethrough is used to indicate configuration information/bits, such as 105.)

The structure of the cell 100 will be discussed in greater detail below with reference to FIG. 3. The address units will be discussed below with reference to FIGS. 4a–c and 5. The writehead circuits 70 will be discussed in greater detail below with reference to FIGS. 6a–b. The head control circuit 90 will be discussed in greater detail below with reference to FIG. 7. The readhead circuits 80 will be discussed further below with reference to FIGS. 8 and 9.

Cell

Figure 3:
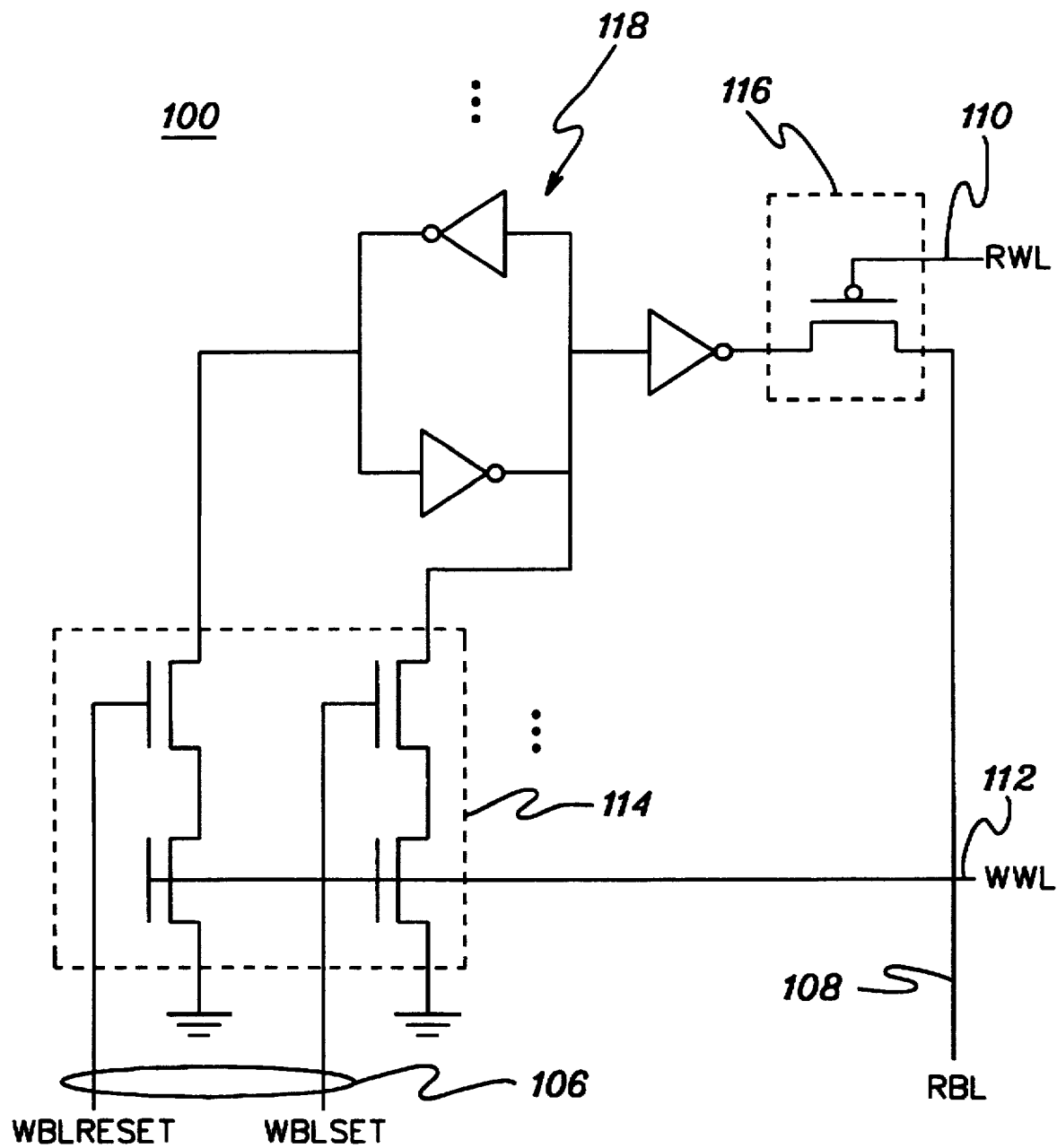
FIG. 3 is a schematic of an exemplary memory cell of a sub-array of FIG. 2.

An exemplary memory cell 100 of a sub-array is depicted in FIG. 3. The storage circuit 118, comprising a pair of cross coupled inverters, is operated via write port 114 and read port 116. The true and complement nodes of the storage circuit are connected to true and complement (set and reset) bitlines 106 through operation of a write wordline 112 in write port 114. A cell is read using a read wordline 110 which operates a read port 116, providing data on read bitline 108. This is an exemplary cell only, and many other cell configurations known to those skilled in the art are possible. As discussed further below, the functional write, initialization write, and reset are accomplished pursuant to the principles of the present invention by employing only the write wordline 112 and the write bitlines 106 through a single write port 114. This is an alternative to multiple write ports, and bitlines and wordlines associated with each write port, for providing separate access to the cell for each of the functions. By sharing the single write port, wordlines and bits lines between the three functions, the cell area can be reduced, and wiring within the sub-array can be decreased, thus improving density.

Address Unit

Figure 4A:
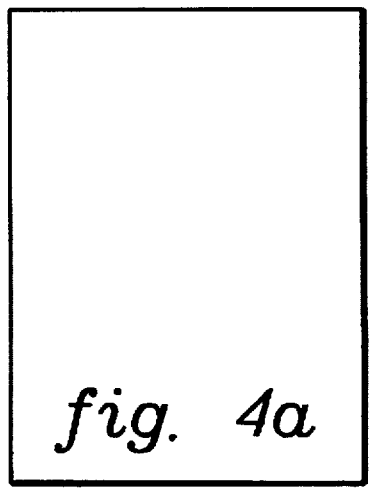
FIGS. 4a–c together are a block diagram of the address system of the present invention together with address and select buses.
Figure 4B:
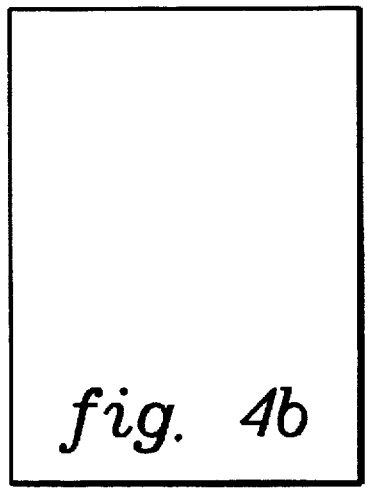
Figure 4C:
Figure 4A:
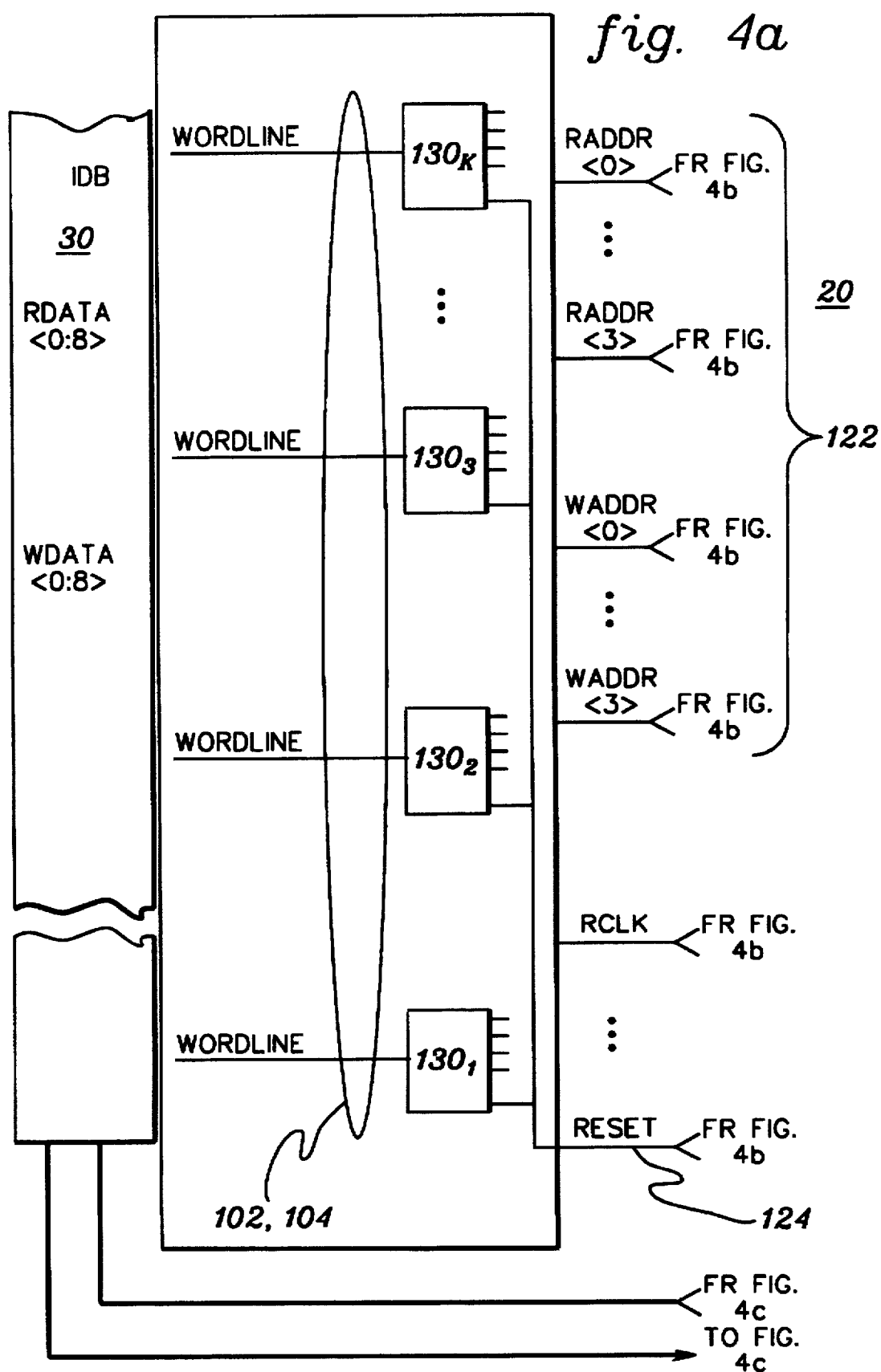
Figure 4B:
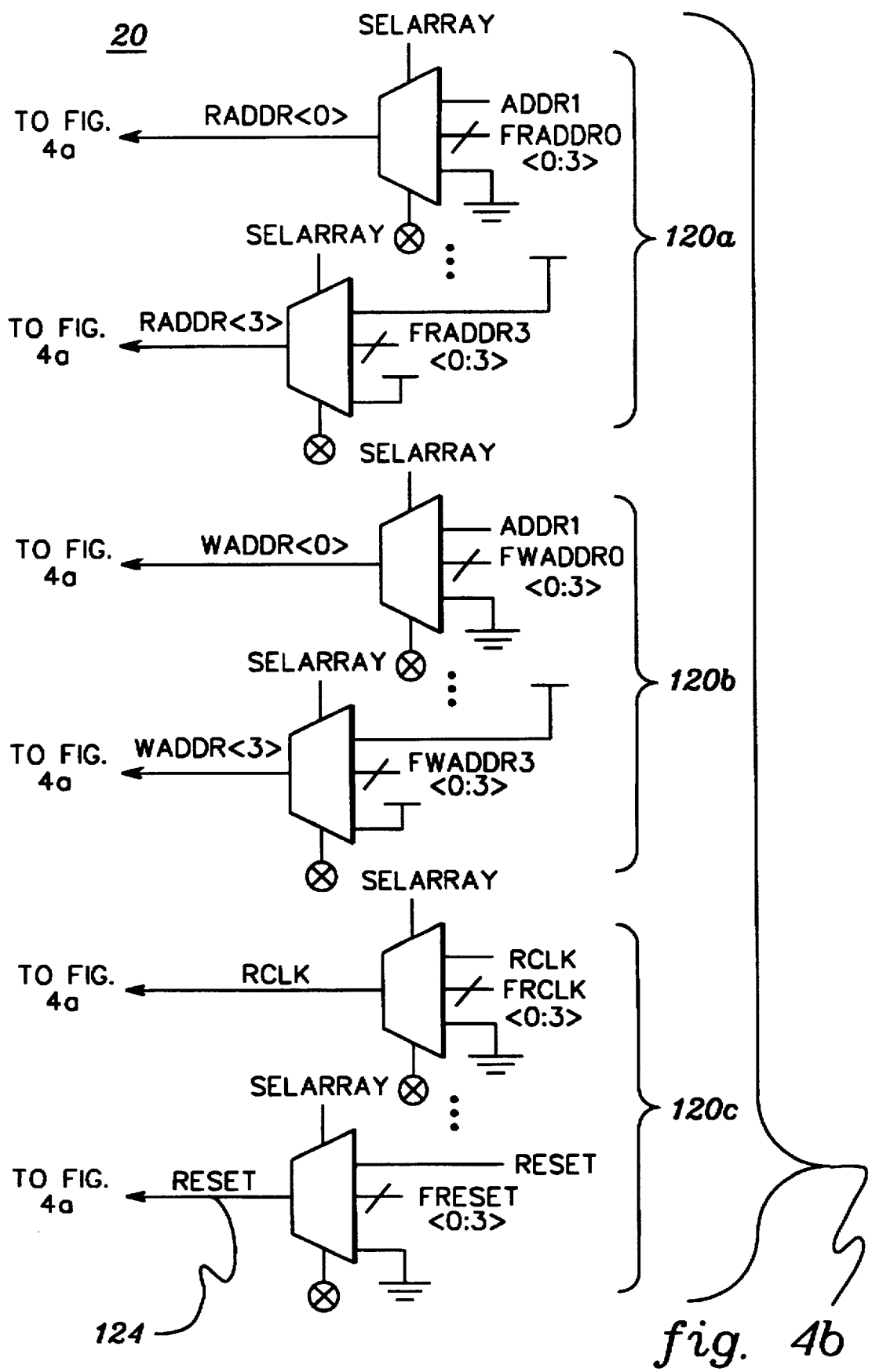
Figure 4C:
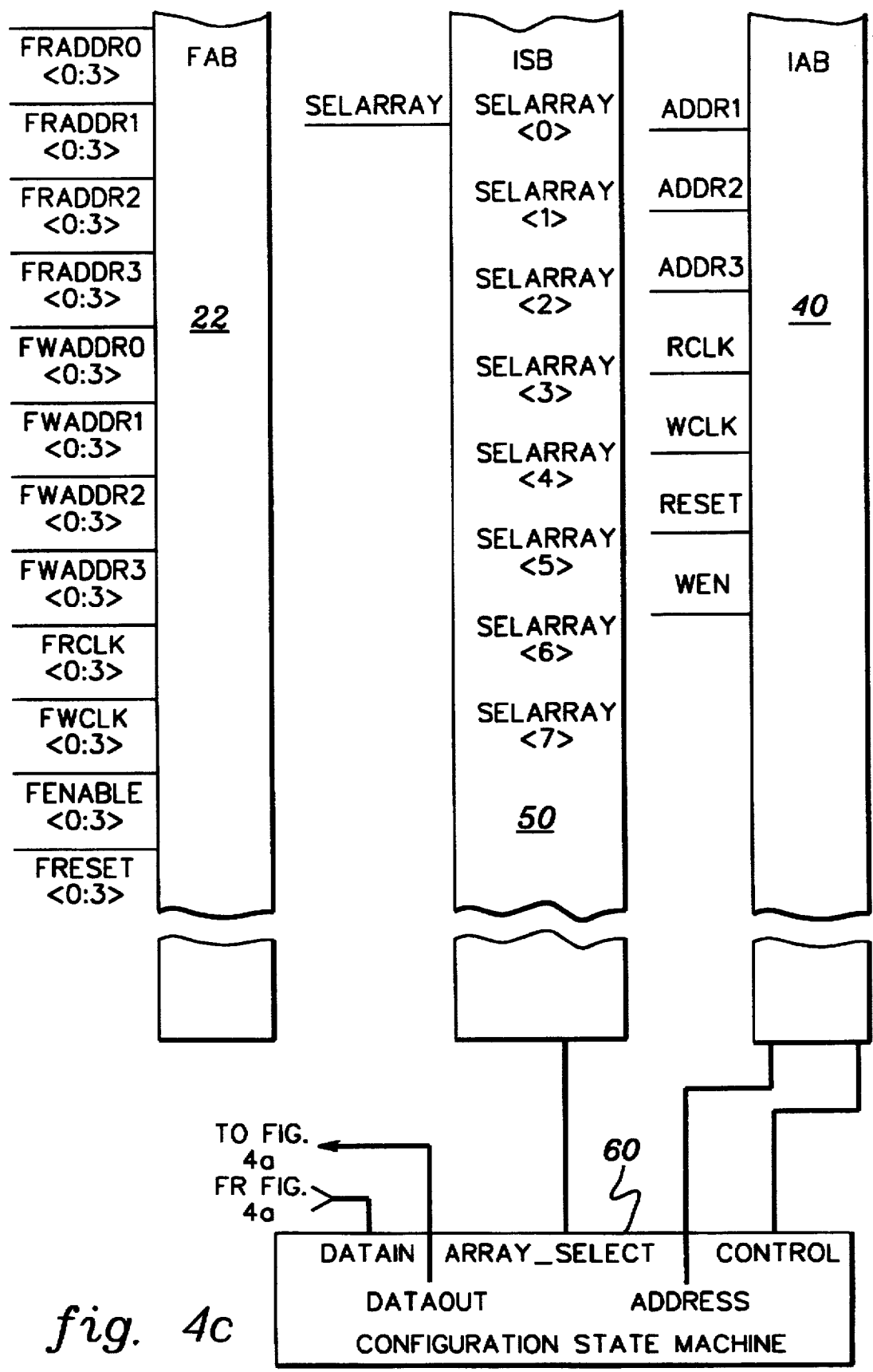

FIGS. 4a–c together comprise a diagram of the disclosed address unit 20, in association with the configuration state machine ("CSM"), FAB, IAB, ISB, and IDB of the present invention. An initialization select bus 50 and the initialization address bus 40 are provided, both of which are driven by the FPMA's configuration state machine 60. Selection multiplexers 120a–c for routing of address and control signals are also provided. FIG. 4a also illustrates the addition of the initialization data bus 30 which will be discussed below.

Exemplary FIGS. 4a, 4b and 4c are drawn showing four address inputs for read and four address inputs for write, collectively 122. Bits 0–2 represent what is referred to herein as the low-order address, and bit 3 represents what is referred to herein as the high-order address. It will be understood to those skilled in the art that alternative address widths and partitioning, dependent on sub-array depth and count, may be provided.

The FAB 22, a hierarchical address bus, provides four exemplary levels of buses for read FRADDR_ <0:3> and four levels for write, FWADDR_ <0:3>, for each bit of address 122. Mulitplexers 120a and 120b are configured by configuration data, to provide the proper selection from the FAB, during functional array operation.

The initialization address bus 40 illustrated in FIG. 4c is comprised of a number of address lines adequate to fully access the sub-array address space (as an example, the bus would be 7 bits wide for a 128 word sub-array). The bus is of a single hierarchy and connects to each of the sub-arrays within the FPMA through multiplexers 120a–120c. The bus is driven from the CSM and allows the CSM to drive undecoded address data to a sub-array.

The initialization select bus 50 of FIG. 4c provides a communication path between the CSM and each sub-array of the FPMA for transmittal of decoded array selects (SELARRAY) generated by the CSM. During initialization operation, a single bit or line of the bus will become active, placing a single sub-array of the FPMA into initialization mode via SELARRAY. At the sub-array level, activation of the initialization select bit overrides the functional configuration of the routing multiplexer circuits 120a–c from the functional address bus/address bundles (the functional configuration being determined by depicted configuration data), thereby connecting the initialization address bus to the inputs of both the read and write portions of the address units. In a similar manner, routing of read clock (RCLK), write clock (WCLK), reset (RESET), and Byte-Write-Enable (WEN) may be routed in the initialization address bus and controlled by the CSM (pluralities of each of these signals, especially WEN, may be routed, depending on the particular embodiment). Activation of the initialization select (SELARRAY) causes the high-order address unit inputs of address 122 (RADDR<3>, WADDR<3>) to be disconnected from the functional address bus (FRADDR3, FWADDR3) by respective high-order ones of the multiplexer groups 120a and 120b. These respective high-order multiplexers connect the highorder address lines (RADDR<3> and WADDR<3>) to a fixed, active value (e.g., $V_{DD}$ shown). The remaining multiplexers of 120a and 120b select initialization address bus address lines (ADDR1, ADDR2, ADDR3) for propagation therethrough to RADDR<0>, RADDR<1>, RADDR<2> and WADDR<0>, WADDR<1> and WADDR<2>, rather than the functional read FR* and write FW* lines. (For simplicity, only one of these multiplexers is depicted for the read 120a and write 120b groups of multiplexers.) Wordline generators 130 combine the low-order addresses as provided by the IAB through 120a and 120b, read or write clocks provided from IAB via multiplexers 120c (also as controlled by SELARRAY), and the high-order address input as forced active via SELARRAY, and activate the appropriate wordline 102, 104.

Alternative embodiments of the initialization system controlled by the CSM could be constructed where either reset or byte-write is not a function used during initialization. In these cases, alternative embodiments would be constructed where RESET was forced inactive at initialization select and WEN was forced active at initialization select, respectively. This is discussed further below.

As the disclosed design allows usage of the functional address decode of a sub-array to be controlled by the CSM, separate configuration wordline generators in the FPGA architecture are not required. As initialization mode addressing occurs in the disclosed address unit 20, an initialization port in each cell is not required, given a means for propagating initialization data on the write bitlines within the sub-array, as will be discussed later. Beyond the inherent density benefit, this also allows for increase of the sub-array configuration address space. Furthermore, the new design provides for dominance of initialization control over functional control at the sub-array level, eliminating contention concerns.

Write Wordline Generator Circuitry

FIG. 4 also illustrates a reset line 124 (FIG. 4a, 4b) between the reset routing multiplexer (FIG. 4b) and address decode/wordline generators 130 (FIG. 4a). An active level on the RESET line forces all write wordlines within the sub-array active regardless of address or clock state, providing a structure with inherent reset dominance in an asynchronous manner. The structure allows use of the functional write port of the memory cell for sub-array RESET operations given a means of propagating reset data on the write bitlines within the sub-array as is discussed below. A separate reset port in the memory cell is not required, thereby allowing the FPMA to be designed with the embodiment of a two port memory cell as discussed above.

Figure 5:
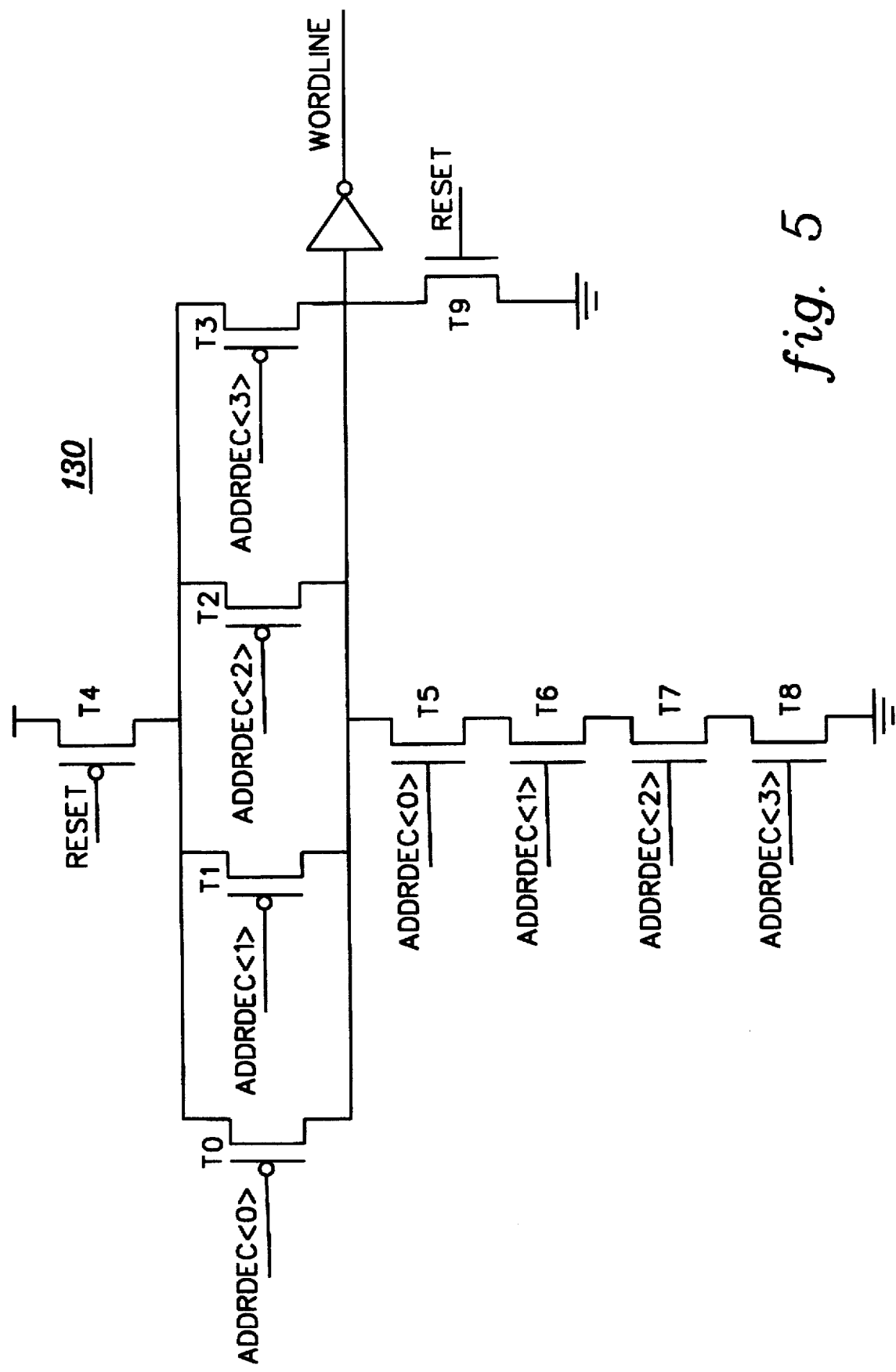
FIG. 5 is a schematic of an exemplary wordline generator of FIG. 4.

An embodiment of a wordline generator circuit 130 with reset dominance is illustrated in FIG. 5. (Those skilled in the art will recognize that any coincidental equivalence between the T notations for transistors across Figures herein does not indicate that the same transistors are employed.) Devices T0, T1, T2, T3, T5, T6, T7 and T8 form an AND circuit for a number of partially decoded address lines driven by the high-order and low-order address units (not shown). NFET T9 is connected to the AND structure to provide for pull-down when RESET is asserted high. PFET T4 is added between the sources of T0, T1, T2 and T3 and Vdd to prevent a DC current path in the device when RESET is asserted. As RESET is asserted, the gate of T9 is pulled down, regardless of decoded address value, and the wordline, formed as an inversion, is pulled high, or active. The resulting effect is that assertion of RESET will cause all write wordlines in the sub-array to be activated. This prevents any concern for contention by default. As capacitive load of the write port gates is roughly equivalent to that of a separate cell reset port, the power consumption increase should be negligible. Given the embodiment of FIG. 5, additional embodiments could be formed with alternative polarity values for RESET, decoded address inputs, and wordline active levels, etc.

Sub-array Writehead

Figure 6A:
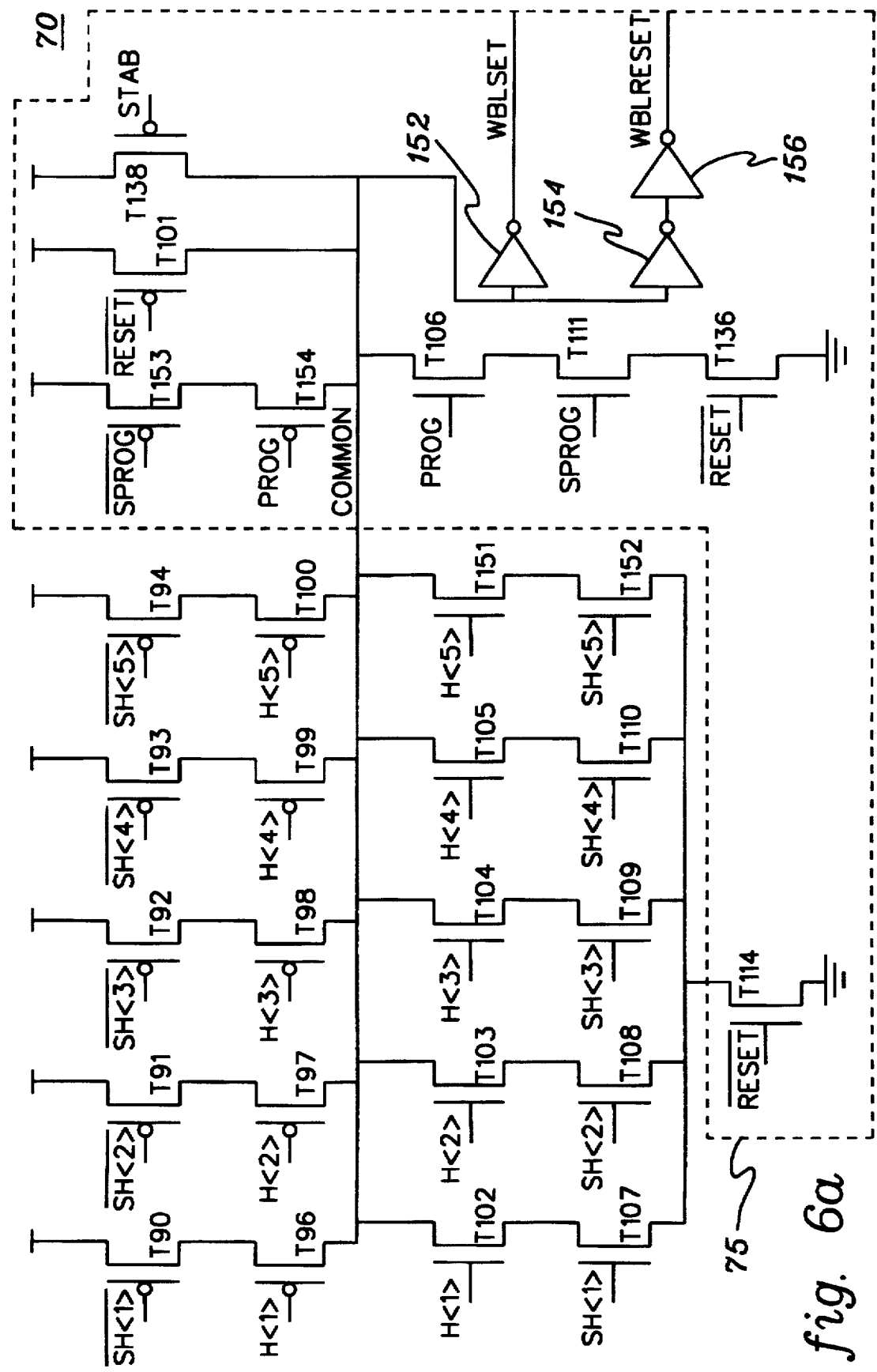
FIGS. 6a–b are schematics of exemplary alternative writeheads of a sub-array.
Figure 7:
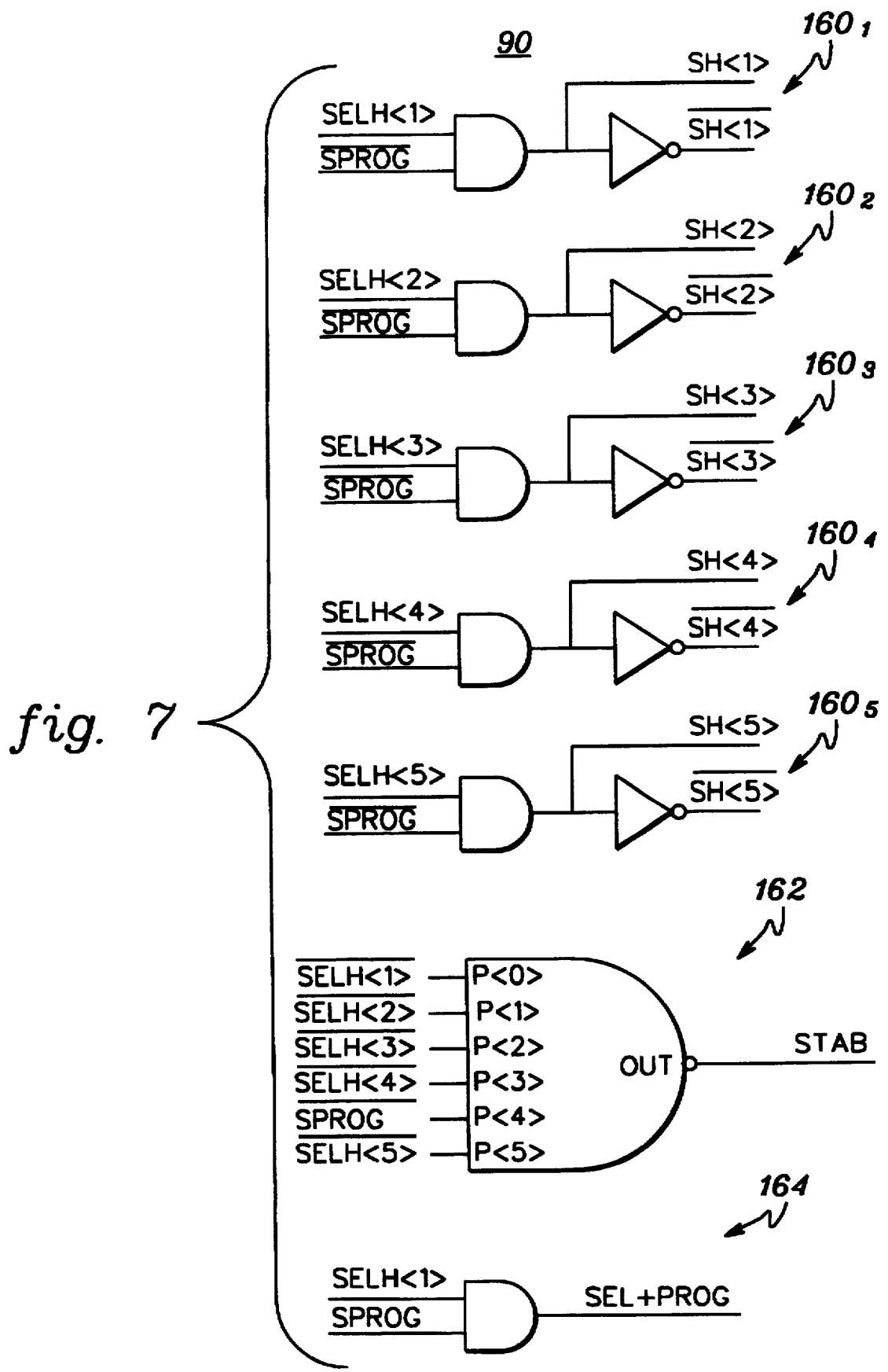
FIG. 7 is an exemplary logical block diagram of a control circuit for both the readhead and the writehead of the present invention.

FIG. 6a depicts an example of a sub-array writehead 70 (without byte-write or sub-element addressing capability) for driving associated bitlines to a column of cells. The circuit as depicted implements a selection/multiplexing function and incorporates an initialization port and reset port data flow into the functional port of the sub-array. FIG. 7 depicts the control portion 90 (FIG. 2) of the sub-array structure which provides routing/function selection to both the readhead 80 and writehead 70 structures in the sub-array. FIG. 6a and FIG. 7 are both drawn to show exemplary address input selection from five possible sources H1–H5. Alternative address selectivity can be provided through changes to the configuration bit count and contraction/expansion of the disclosed circuit elements.

Within the writehead of FIG. 6a, PFET devices T90–T94, T96–T100 and NFET devices T102–T105, T107–T110, T151 and T152 implement a tristate multiplexer design. Multiplexer control is provided from the head control unit 90 of FIG. 7 given configuration bits of the distributed configuration memory of the FPMA. As an example, should SH<1> and NOT SH<1> (select hierarchy 1 signals from head control unit of 90 FIG. 7) be asserted, the data appearing at the input to inverters 152 and 154 would be the inversion of H<1> (hierarchical data level 1). NFET devices T114 and T136 as well as PFET device T101 implement the reset function within the writehead. Assertion of RESET at the writehead forces the bitlines to a value capable of resetting the memory cells to logic '0'. T101 is responsible for pulling the common node of the multiplexer upward, while T114 and T136 prevent cross-through current into the functional or initialization NFET structures which would occur under certain conditions. If the configuration state machine does not include capability to use the reset function, device T136 may be dropped without risk of a DC current path. PFET devices T153 and T154, and NFET devices T106 and T111 implement a multiplexing function to gate the initialization data onto the write bitline in the sub-array with multiplexer selection SPROG and NOT SPROG being provided by the initialization select bus discussed above. PFET T138 is responsible for providing a stable level at the intermediate node of the multiplexer in situations when no bitline input is chosen, the reset is unasserted, and the sub-array is not in initialization mode. This situation would occur during array initialization, in situations where the sub-array was not used in the FPGA application, or in applications in which the sub-array is configured as a ROM.

Inverters 152, 154 and 156 form an arbitrary bitline driver configuration whose characteristics would change with changes in the memory cell embodiment chosen. As an example, FIG. 6a shows a driver for a differential capacitive drive write protocol for the cell of FIG. 3, in which case, the current load on the head does not vary with the number of cells (words) accessed. If the writehead were designed for use with a memory cell architecture in which current was sourced or sunk through transfer gates, additional embodiments of device T101 could be placed along the write bitline to ensure ample current capability and reduce current density during RESET, when a multiplicity of memory cells would be drawing current from the writehead. These additional embodiments may be replications of device T101, or may be of opposite device type, or a combination, depending on the write bitline architecture chosen.

As discussed further below, embodiments of the present invention may provide for sub-element addressing, especially in connection with an FPGA where the FPMA sub-array word width is larger than the word width of the FPGA configuration state machine. The devices collectively referred to as 75 in FIG. 6a could be replaced by the devices collectively referred to as 75' in FIG. 6b, in such embodiments.

Figure 6B:
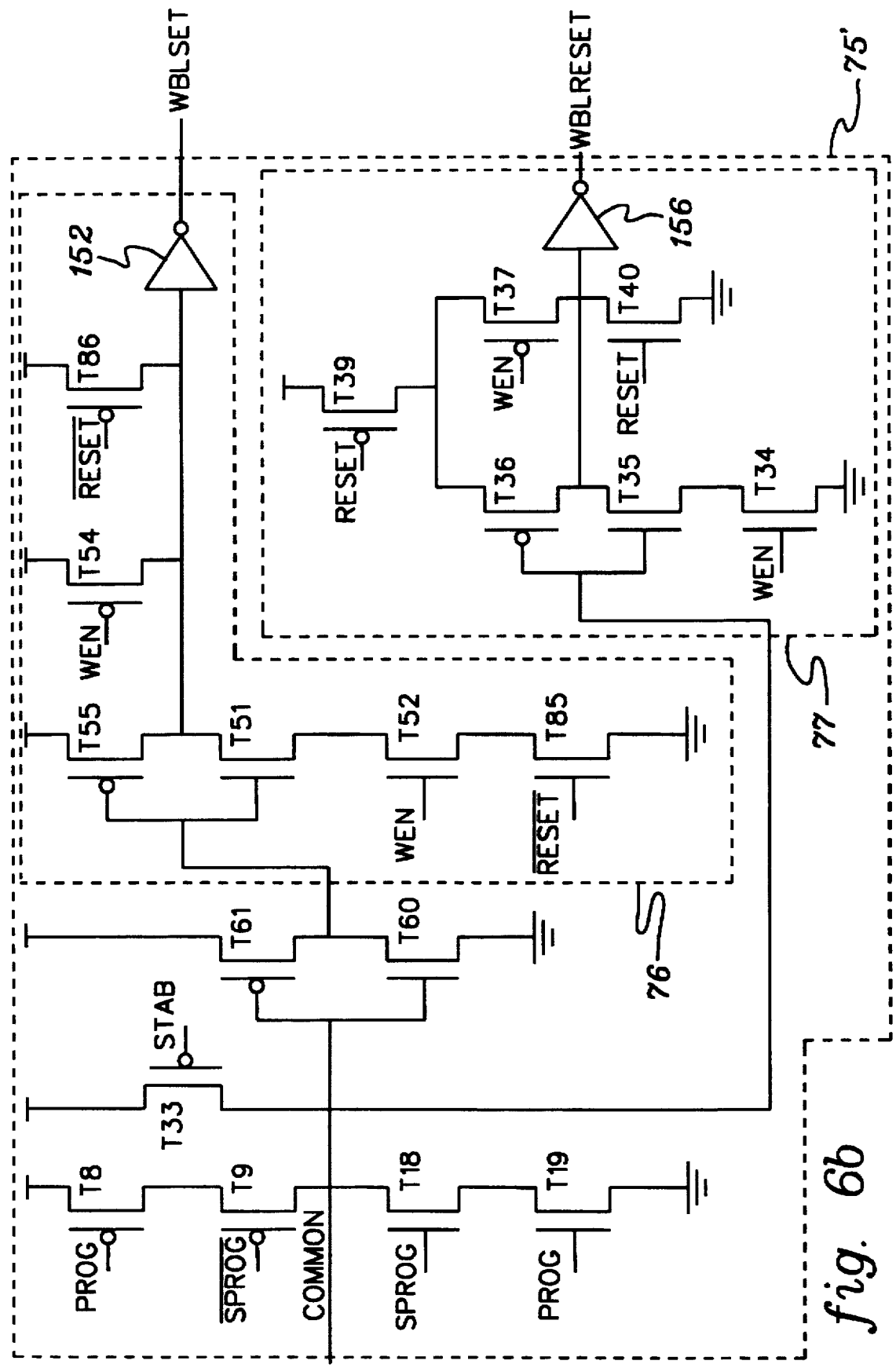

With reference to FIG. 6b, a WBLSET portion 76 is shown therein incorporating devices T52 and T54, responsive to a WEN signal. Similarly, WBLRESET portion 77 incorporates devices T34 and T37 also responsive to WEN. A '0' on WEN forces WBLSET and WBLRESET to '0,' thus inactivating the bitline pair connected thereto. A '1' on WEN activates the bitline pair as responsive to the hierarchy multiplexer, PROG, SPROG, STAB, and RESET as discussed above with reference to FIG. 6a. (Those skilled in the art will recognize that, given the modified arrangement of the RESET devices in FIG. 6b over FIG. 6a, the RESET function nevertheless operates as required.)

By routing multiple write enable (WEN) lines to different groups of writeheads (e.g., upper and lower byte), the writehead groups can be controlled to alternately access each respective bitline group, thus effecting a sub-word or sub-element addressing capability.

The control circuit 90 of FIG. 7 provides primary control for the writehead. The write control circuit includes an AND-INVERT block 160 for each functional data path capable of being multiplexed into the writehead. Inputs SELH<1>–SELH<5> in the diagram are sourced from configuration bits. NOT SPROG is the inversion of the initialization select as provided by the initialization select bus. Each AND-INVERT block 160 functions to assert the SH<> and NOT SH<> signals associated with it, thereby enabling a data path when configuration data sets up the connection and sub-array initialization is not underway. Allowed bitstream setups prevent enabling of more than one path at the same time, while the AND of NOT SPROG implements initialization port dominance over the functional data port and prevents data contention.

A wide NAND gate 162, into which the inverted form of all configuration bits associated with the head path selection and NOT SPROG is fed, provides condition detection for stabilization of the writehead multiplexer intermediate node by input signal STAB. A two input AND function 164 within the head control circuit 90 detects conditions where a hierarchy 1 data path is selected and initialization is enabled in order to properly stabilize the read port, as will be discussed below.

Sub-array Readhead

FIG. 2 depicts the control and data interface structure to a sub-array, including a readhead circuit 80 comprised of clock generator and read capture latches 81, selective tristate driver/MOSFET selective switches 82, and bitline structures 14. Detailed operational descriptions of the clock generator and read capture latches, as well as the selective tristate driver/MOSFET selective switches can be found in the incorporated FPMA Application.

To the embodiments disclosed in the FPMA Application, additional control via head control circuit 90 is provided to isolate the sub-array from read bitline hierarchies connecting multiple sub-arrays. Head control gates 160 or equivalent, depicted in FIG. 7, disable the MOSFET selection switches/ selective tristate drivers 82 from driving upper read bitline hierarchies when the ISB is active. (In the FPMA Application, MOSFET selection switch/selective tristate driver conditioning was provided solely by configuration data.) Disconnect of a sub-array from read bitline hierarchies above Hi prevents contention of the sub-array being initialized with other sub-arrays sharing the upper hierarchy bitlines, should an attempt be made to access the sub-array via the functional address bus which is also disconnected, thereby providing for known value output for the functional access.

Additionally, head control unit 90 configures clock generator/read capture latch 81 associated with the ISB-selected sub-array to capture read data from the H1 read bitline hierarchy, regardless of configuration data settings which provided sole selection/control of these structures in the incorporated FPMA Application. Control of unit 81 may require additional logic within head control unit 90 not expressly detailed in FIG. 7, or alternatively in clock generator/read capture latch 82, however, appropriate enablement/disablement logic structures would be apparent to one skilled in the art given the above description.

Figure 8:
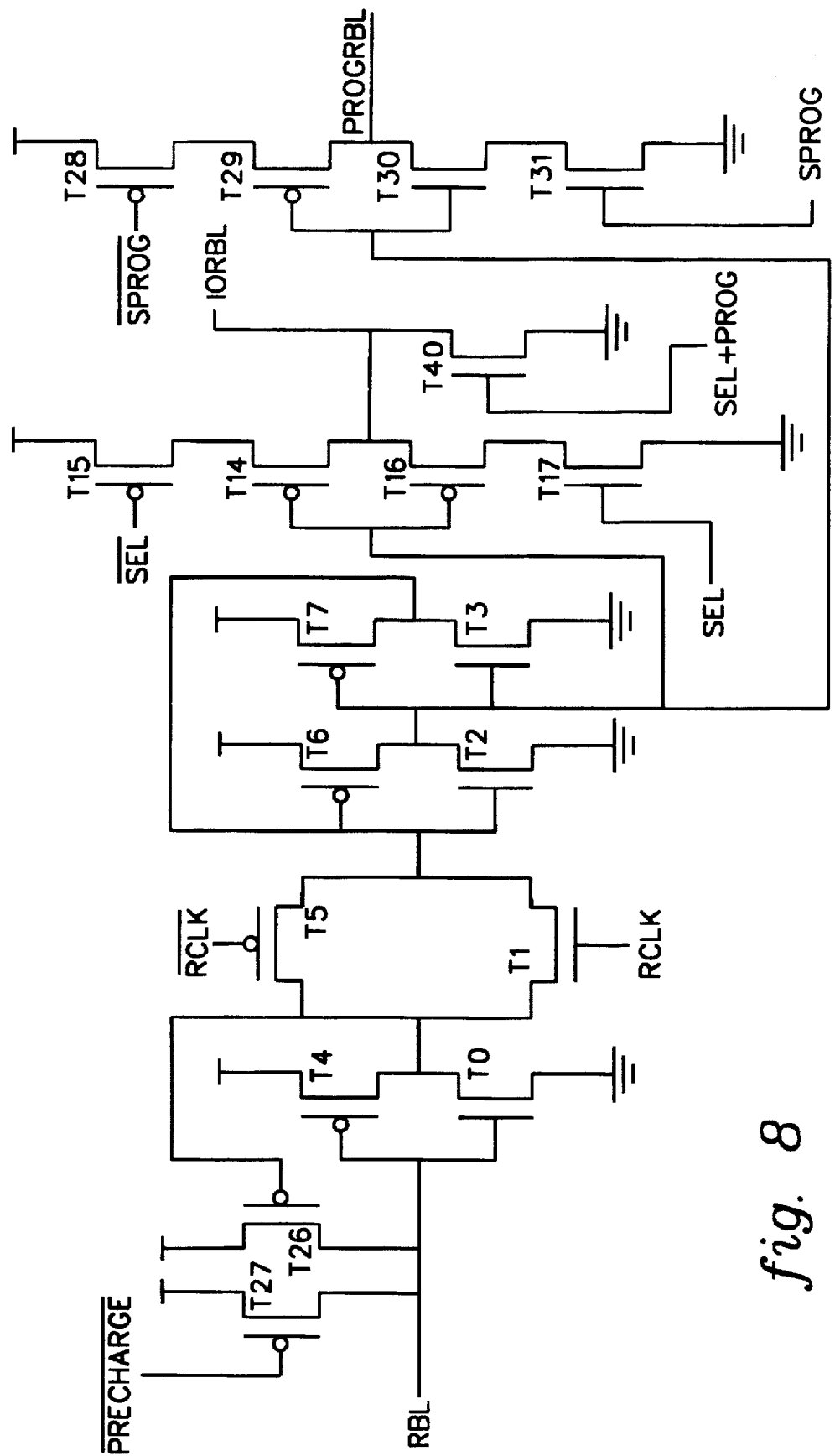
FIG. 8 is a schematic of an exemplary capture latch portion of a readhead of a sub-array.
Figure 9:
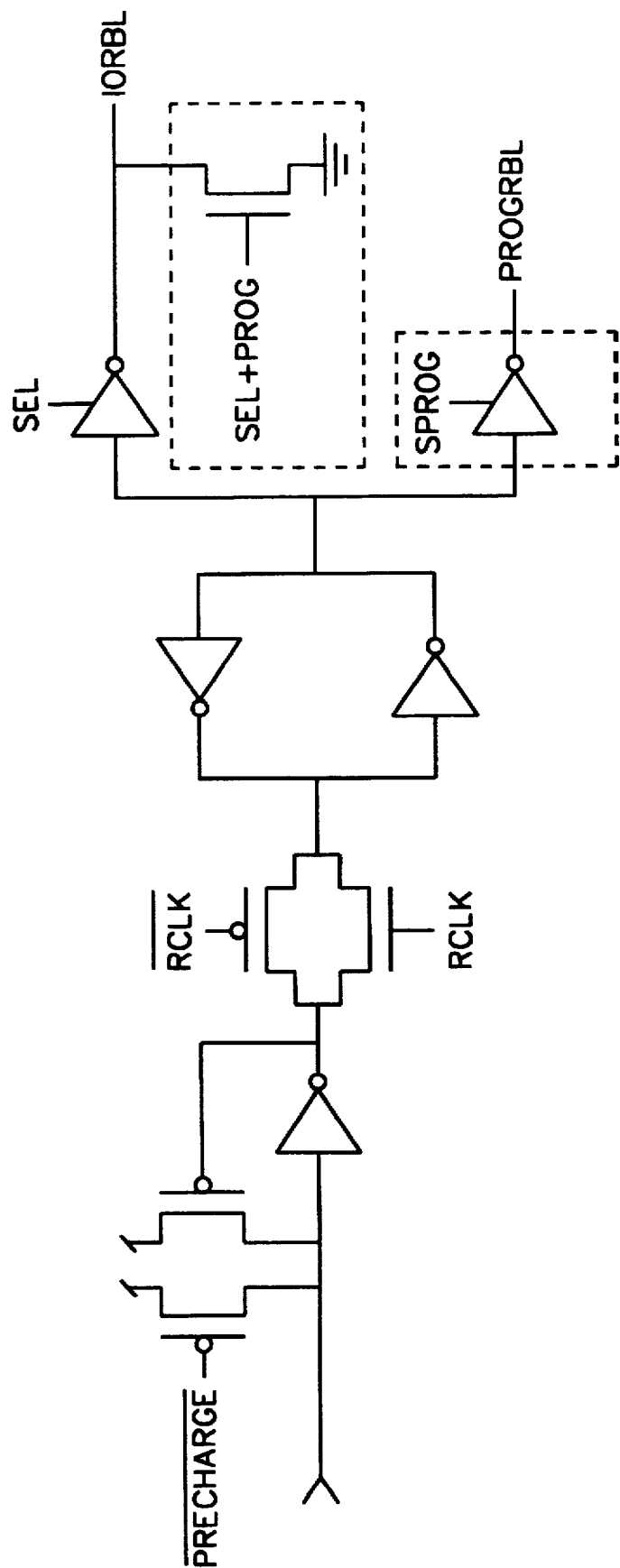
FIG. 9 is a logical block diagram of the capture latch portion of the readhead of FIG. 8.

FIGS. 8 and 9 depict a read capture latch portion of the readhead 80 implemented using a single-ended precharged input and without byte selection devices. FIG. 9 is merely a higher level logical diagram of the read capture latch of FIG. 8. Those skilled in the art will recognize the correspondence therebetween. Devices T26, T27, T0–T7 implement bitline precharge, bitline stabilization, sampling, and latching functions for the readhead as disclosed in the incorporated FPMA Application. Devices T14–T17, also part of an embodiment of the FPMA Application, implement a tristate inverter primarily controlled by configuration data and providing a selectable path between the sub-array read port data latch and the FPMA's I/O unit (via IORBL).

To the embodiment disclosed in the FPMA Application, additional stabilization device T40 is provided at the output of the IORBL tristate inverter (devices T14–T17). Device T40 works in conjunction with additional tristating capability for the IORBL inverter as provided by the head control circuit 90 during ISB selection to disconnect the read capture latch from a functional I/O path selected via configuration data and provide a known "precharge-capture" equivalent logic value to functional I/O during initialization of the associated sub-array. As such, the device type of T40 is chosen dependent on the precharge logic value to be asserted at the output, with an NFET being shown for example. Together, stabilization by device T40 and isolation of the sub-array from its read bitline hierarchy provide for known value return from the sub-array if functional read is attempted during initialization, regardless of functional connectivity of the sub-array to other sub-arrays and I/O as determined by configuration data. The additional gating of control signals deriving devices T15 and T17 is not expressly indicated in the control circuit of FIG. 7 (which as drafted applied primarily to the writehead), but assumed as hierarchy control at the sub-array is identical between the readhead and writehead.

Devices T28–T31 are also added to the read capture latch portion of the incorporated FPMA Application to provide a selectable data path (PROGRBL) between a sub-array readhead and a CSM via the read portion of the initialization data bus, thus providing for read and read/compare operations on initialization data by the CSM. Devices T28–T31 implement a tristate inverter, generally equivalent in design to T14–T17, but enabled during ISB selection of the associated sub-array to provide direct connectivity between the sub-array read port and CSM in initialization mode.

Configuration State Machine (CSM)

Figure 10:
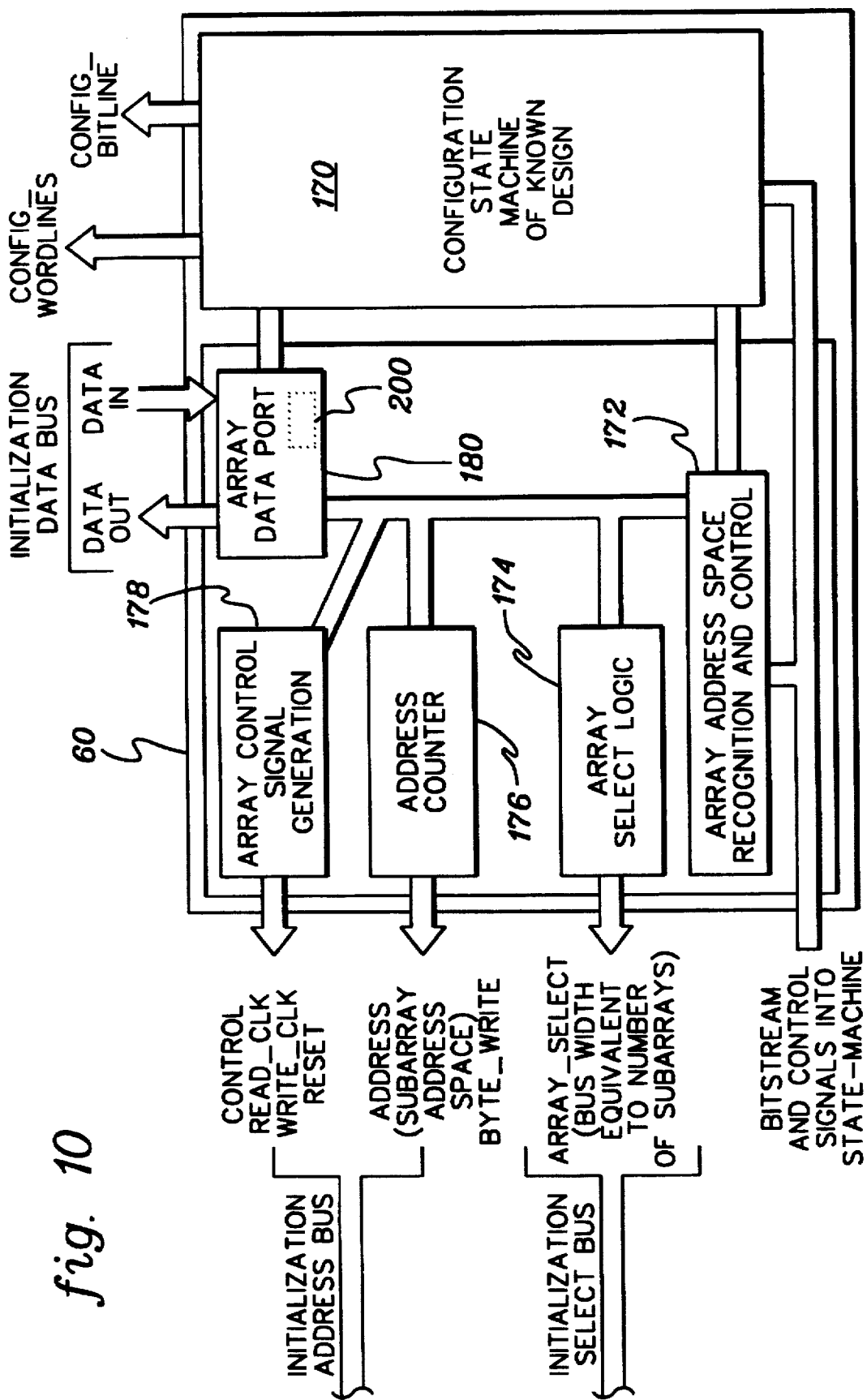
FIG. 10 is a block diagram of a configuration state machine pursuant to the principles of the present invention.

FIG. 10 illustrates an architecture of the CSM 60 of FIGS. 1 and 4. Within an FPGA/FPMA (generally, "programmable systems"), the function of a configuration state machine is to interpret an incoming bitstream containing both address information and configuration data information in conjunction with certain external control signals, in order to correctly load the distributed configuration memory of the programmable system, thereby personalizing the logic cells and routing within the programmable system to perform a desired function. The methodologies by which FPGAs handle this function are known and varied, and will not be described here. To such known configuration logic 170, several new units are added to facilitate initialization of FPMA sub-array RAM bits via the CSM.

The ARRAY ADDRESS SPACE RECOGNITION AND CONTROL UNIT 172 sifts the incoming configuration bitstream for address information within the FPMA initialization address space. These windows are of constant length, as the entire depth of the sub-array will be initialized. When a request to initialize within a sub-array window is detected, normal state machine operations suspend and bitlines/ wordlines common to the FPGA are not asserted. Address space information is decoded by the ARRAY SELECT LOGIC 174 to determine which of the sub-arrays is to be initialized. The unit then asserts the appropriate bit of the initialization select bus to control the address/data multiplexer circuitry at the sub-array.

The ADDRESS COUNTER UNIT 176 is responsible for generating a contiguous address stream which is driven onto the initialization address bus for decode by the selected array.

The ARRAY CONTROL SIGNAL GENERATION UNIT 178 is responsible for interpreting bitstream and control data to determine the desired initialization function (WRITE, READ, or READ COMPARE) and providing the correct clocks to the sub-array via the initialization address bus.

The ARRAY DATA PORT 180 serves as a virtual address for all sub-array initialization data sifted from the configuration bitstream to be written to the FPMA, regardless of sub-array number or address. This unit drives a bus network (IDB) of bit width equivalent to the sub-array which is connected to each sub-array in a manner described above. (In embodiments where the sub-array word width is less than or equal to the configuration state machine bit width, or where multi-cycle initialization byte construction is being used, this bit width definition (sub-array width) is true. In the preferred embodiment, the width of the array data port is equivalent to the configuration state machine bit width, and write enable signals could be used to direct data.) A READ BUS (not shown) is also provided within the IDB for READ and READ COMPARE operations with necessary communication between the unit and the CSM to provide debug capability. Translation between the two port RAM system and the one port configuration system is also provided for in the ARRAY DATA PORT unit. (Optional parity unit 200 is discussed below.)

Overview of Operation

Normal functional operation of the read and write ports of a memory array constructed using the present invention proceeds in a manner consistent with that disclosed in the FPMA Application.

In accordance with the present invention, when the active edge of the reset signal arrives at the sub-array, the signal is buffered and routed to the last stage of the write wordline generator circuits. The asserted reset signal forces all write wordline generators to assert their respective wordlines, turning all write wordlines within the sub-array active, and subsequently activating the write transfer gates of all cells of the sub-array. Simultaneously, the reset signal is routed to the writehead circuitry of the sub-array where it tristates any functional or initialization data path into the writehead which may cause contention, and asserts a logic value on the output of the writehead appropriate for resetting all the cells to which the bitline it drives are connected. Alternatively, if a logic value other than '0' was desired, the function could be implemented in the same basic manner with reversal of device types, active levels, and contention current prevention. Reset active time is related to the cell architecture of the RAM and sub-array size.

Also in accordance with the present invention, a bitstream interpreted as a sub-array initialization command by the configuration state machine asserts a single line on the initialization select bus. Activation of this line along with subsequent true and complement generation at the sub-array disconnects the sub-array address unit, writehead units, and readhead units from their functional routing which is controlled by configuration data, and connects these units to the initialization address bus and initialization data bus, respectively. High order address signals, and write enable signals, are forced active to allow operation of the sub-array given a low order address and RCLK, or WCLK assertion by the CSM. Thus, a single sub-array, isolated from its functional connections as defined by configuration data results. The state machine proceeds to issue write and read commands to the array initialization interface as determined by the state machine initialization mode. Data to be written to the sub-array is placed at a virtual address which provides buffer to the write initialization data bus for drive to all sub-arrays, and reception by a single sub-array. In a like manner, read data is received at the virtual port. The state machine cycles through all addresses within the sub-array in an ascending binary manner, fully writing or reading the address space. Attempted functional writes to the sub-array will have no effect due to the address and data disconnect. Attempted reads will return a logic value based upon the precharge logic level of the array to the I/O regardless of hierarchy of data connection due to the sub-array isolation as provided by the readhead described previously. As the sub-array is isolated from bitlines 14, discharge of upper hierarchy bitlines by a sub-array is not possible during initialization and attempted read access via an upper hierarchy returns the precharge level of the bitline. Activation of device T40 (FIG. 8) in conjunction with tristated capture latch outputs mimics a precharge level capture in cases where the capture latch used in initialization of the sub-array is also being utilized as a functional data output as configured by configuration data. At the completion of initialization, the initialization select line is unasserted and address/data routing is relinquished to the functional connections established by FPGA/FPMA configuration data.

Differing Sub-Array and Configuration Data Bus Widths

All SRAM based FPGAs require a means for loading the configuration bitstream, which consists of data used to set multiplexer select pins, load look-up-tables, etc. to provide a user-desired logic function. Configuration load is generally accomplished using the CSM within the FPGA. The CSM reads data from a discrete ROM in either parallel or serial format, decodes the address space into which to load the configuration data, converts the configuration data to a parallel bitstream, and finally, asserts the appropriate configuration bitlines and wordlines within the FPGA to load the data. The state machine, bitlines, and wordlines of the programming interface are designed for a specific configuration word width which is generally driven by the availability of off-the-shelf parallel ROMs to use with the FPGA.

ROS (read-only-store) mode for an associated FPMA involves loading the FPMA memory with a desired pattern during configuration of the associated FPGA. The design of a flexible FPMA for incorporation within an FPGA with a ROS mimic capability requires capability for initialization of the memory array via the CSM in order to load the ROS personalization pattern. As a result, the sub-array design must follow one or more of the following constraints:

1. The sub-array width (Nbit) must equal the configuration word width if the functional RAM wordlines are to be used; or
2. The sub-array word width must be an integer multiple of the configuration word width, and special programming wordlines must be inserted into the architecture for efficient use of the array. Non-integer multiples yield increasingly inefficient programming in large sub-array spaces.

Figure 11:
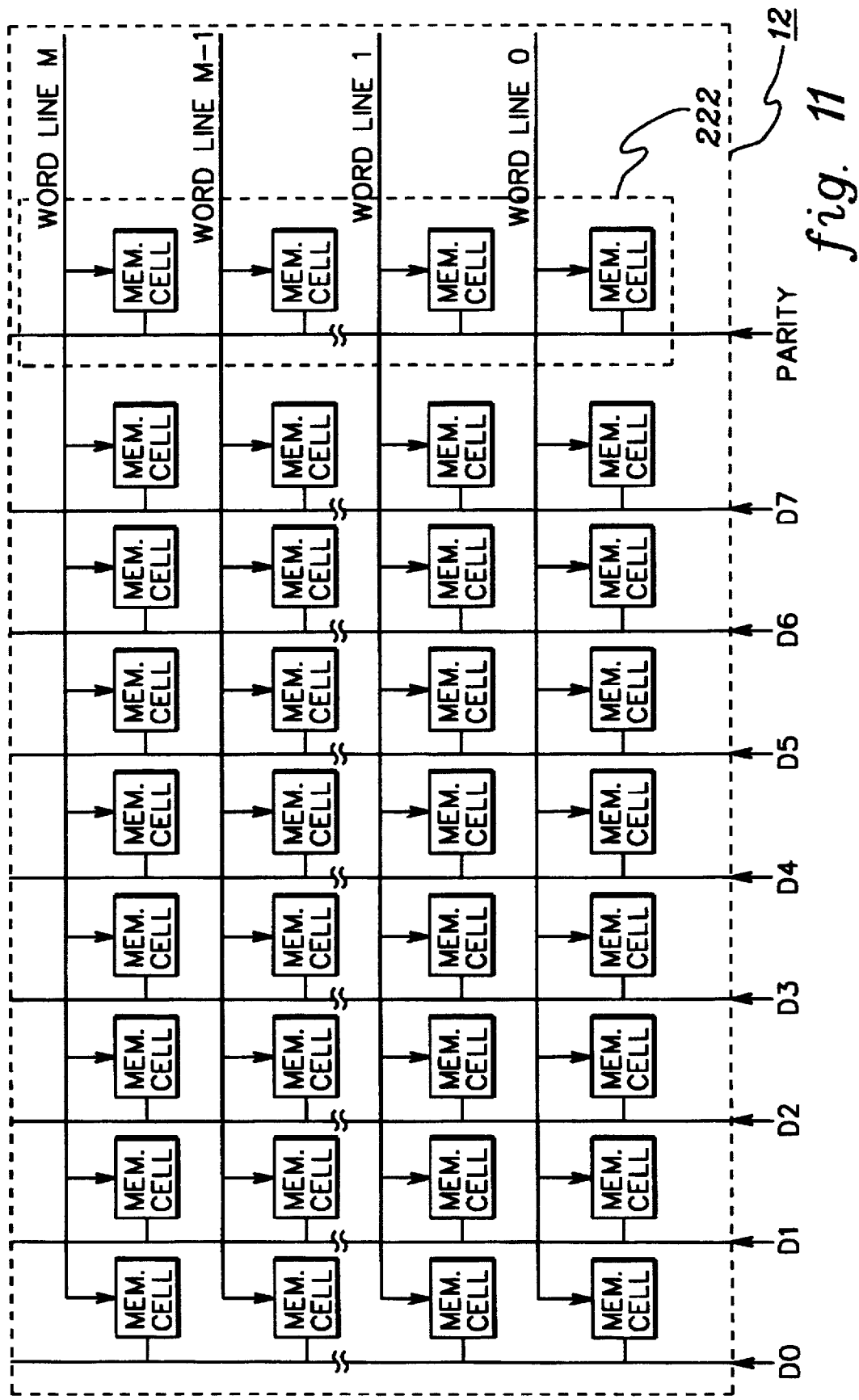
FIG. 11 is a partial diagram of a sub-array having a column of cells dedicated to parity.

Because the number of bits in a configuration byte as generated by the CSM is closely associated with the width of the associated FPGA configuration data bus, additional modifications can be made to the CSM to handle cases where Nbit of an FPMA sub-array is not equivalent to Nbit of the configuration data bus of the FPGA. In cases where Nbit differs by only a bit or two, the unmatched bit(s) may be either tied to a known value, or alternatively, assumed to be parity, and be programmed with a parity generation result from an independently programmed line set in the initialization data bus set through the addition of a parity generation unit 200 within the CSM ARRAY DATA PORT, as shown in FIG. 10 (Unmatched data bits would not be checkable in read/compare modes of sub-array initialization and the effective bit-width of the sub-array in programmed modes is equivalent to the configuration data bus width.) FIG. 11 illustrates an example of a portion of a sub-array 12 containing words of width 8 bits plus one parity bit. The writehead associated with column 222 of parity bits would receive data from the parity line in the initialization data bus.

Figure 12:
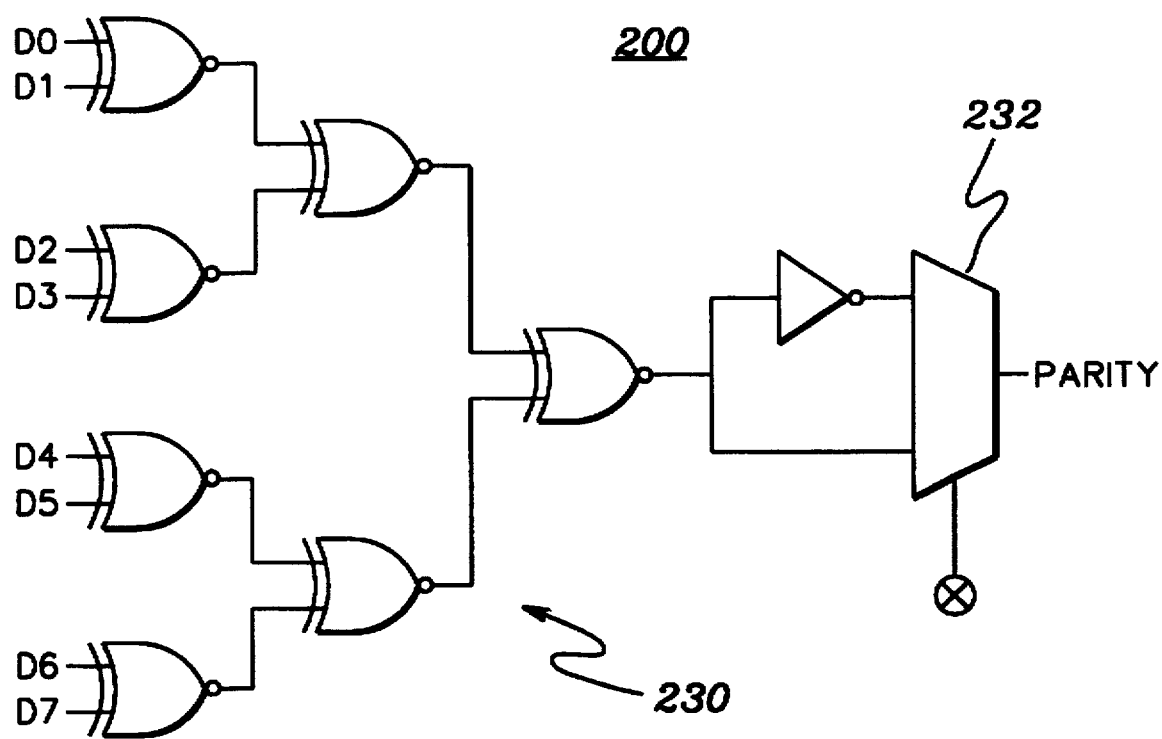
FIG. 12 is a logic diagram of an exemplary parity generator.

Each of the N bits in the configuration word is fed to one or more parity generators 200 in the CSM. FIG. 12 illustrates an exemplary parity generator 200. Each parity generator may consist of an XNOR tree 230 capable of generating parity for the full N bit word, or in the case where multiple parity bits would be allowed in the sub-array, a subset of the N parity bits. Each XNOR tree implemented drives its true and complement output to a multiplexer 232, which is controlled by a configuration bit set during earlier configuration to determine the desired parity type; even or odd, and the chosen polarity of the parity is driven onto one of the parity bitlines which is local to the sub-array.

Once generated, a single wordline gates the N bits in the original programming word plus the bits in the parity word into the sub-array word simultaneously. The wordline used may be either a dual use wordline (as discussed in detail above) which also operates in functional mode, or a wordline which is used only for initialization mode. The resulting architecture saves implementation of numerous programming wordlines dedicated to programming the M parity bits not covered by the configuration word width, and also allows for the use of the functional wordline in configuration mode.

Those skilled in the art will recognize that additional placement/embodiments of the parity generation unit are possible.

The above-incorporated application entitled "PROGRAMMABLE PARITY CHECKING AND COMPARISON CIRCUIT" describes a parity checking function and a comparison function (including comparison of a stored parity bit and a calculated parity bit).

In cases where Nbit of the sub-array is a multiple of Nbit for the configuration system, two additional embodiments of the system exist.

The first involves configuration byte concatenation/deconcatenation within the CSM to construct the necessary bit-width during initialization writes, and decomposition of the initialization bit-width into multiple configuration bytes in read/compare modes. This embodiment requires multiple FPGA configuration cycles for each FPMA initialization cycle with associated updates to the CSM.

A second embodiment implements the initialization function with multiple passes through the sub-array address space and sharing of the configuration byte amongst multiple configuration-byte-widths of the sub-array. In this case, the CSM would also control the state of multiple byte-write enable inputs to the writeheads of the sub-array (multiple lines) to determine the byte destination of the data, thereby providing sub-element addressing for the sub-array (as discussed above, especially with reference to FIG. 6b). In a similar fashion, data selected for read from the sub-array during read/compare would be a function of the WEN lines. For example, operation of the read port is slightly modified. Control signals SPROG and NOT SPROG connected to devices T28 and T31 of FIG. 8 would become the AND of one of the plurality of ISB signals and the WEN signal associated with a subportion of the sub-array word. Therefore, assertion of the desired WEN signal would gate read data from the bitline/capture latch of FIG. 8 to the read portion of the initialization data bus of lesser width. This embodiment requires modification of units within the CSM, but maintains the one-to-one correspondence of FPGA and FPMA configuration cycles.

A combination of the above techniques can also be used. For example, in one embodiment, the word width of the sub-array is 18 bits, but the configuration word width is 8 bits. For the first 16 bits of the sub-array word, an upper and lower byte enable signal could be provided. The remaining 2 bits could be tied to a fixed level, or alternatively used for parity.

Described hereinabove is a system for programmably sharing the wordlines, bitlines, and read and write ports of a memory array among a plurality of address and data sources, including, for example, functional, initialization and reset. This invention improves the overall density of the memory array by obviating the need for otherwise redundant wordlines, bitlines, read and write ports, and associated driving circuits.

While the invention has been described in detail herein in accordance with certain preferred embodiments thereof, many modifications and changes therein may be affected by those skilled in the art. Accordingly, it is intended by the following claims to cover all such modifications and changes as fall within the true spirit and scope of the invention.

What is claimed is:

1. A memory array having a plurality of memory cells, the plurality of memory cells comprising first and second portions of memory cells, the memory array comprising:

a first address bus for carrying first address information;

a second address bus for carrying second address information;

a first programmable selection circuit disposed between the first address bus, the second address bus, and the first portion of memory cells, the first programmable selection circuit being programmable to propagate address information from either the first address bus or the second address bus to the first portion of memory cells; and a second programmable selection circuit disposed between the first address bus, the second address bus, and the second portion of memory cells, the second programmable selection circuit being programmable to propagate address information from either the first address bus or the second address bus to the second portion of memory cells.

2. A memory array having a plurality of memory cells, the memory array comprising:

a first address bus for carrying first address information for accessing at least a portion of the plurality of memory cells of the memory array;

a second address bus for carrying second address information for accessing the portion of the plurality of memory cells of the memory array; and a programmable selection circuit disposed between the first address bus, the second address bus, and the portion of the plurality of memory cells, the selection circuit being programmable to propagate address information from either the first address bus or the second address bus to the portion of the plurality of memory cells;

wherein the portion of the plurality of memory cells is accessed using a plurality of wordlines, the memory array further comprising:

a wordline generator system disposed between the programmable selection circuit and the plurality of wordlines, the first or second address information being programmably propagated to the wordline generator system from the programmable selection circuit.

3. The memory array of claim 2, wherein the wordline generator system further comprises:

a reset circuit connected therein such that each of the plurality of wordlines is asserted by the wordline generator system upon receipt of a reset signal by the reset circuit of the wordline generator system.

4. A memory array having a plurality of memory cells, the memory array comprising:

a first address bus for carrying first address information for accessing at least a portion of the plurality of memory cells of the memory array;

a second address bus for carrying second address information for accessing the portion of the plurality of memory cells of the memory array; and a programmable selection circuit disposed between the first address bus, the second address bus, and the portion of the plurality of is memory cells, the selection circuit being programmable to propagate address information from either the first address bus or the second address bus to the portion of the plurality of memory cells;

wherein the portion of the plurality of memory cells is accessed using a plurality of bitlines, the memory array further comprising:

a first data bus;

a second data bus; and a plurality of programmable write circuits, each disposed between the first data bus, the second data bus, and a respective write bitline of the plurality of bitlines, each write circuit being programmable to propagate data to a respective bitline from either the first data bus or the second data bus.

5. The memory array of claim 4, wherein each programmable write circuit further comprises:

a reset circuit connected therein such that the respective write bitline is set to a reset voltage level upon receipt of a reset signal by the reset circuit of the respective write circuit.

6. The memory array of claim 4, further comprising:

a programmable read circuit associated with each of a respective read bitline of the plurality of bitlines, each read circuit being programmable to propagate data from its respective read bitline to the first data bus and/or the second data bus.

7. A memory array having a plurality of memory cells, the plurality of memory cells comprising first and second portions of memory cells, the memory array comprising:

first and second address sources;

first and second data buses;

a first address unit for driving a plurality of write wordlines associated with the first portion of memory cells based on address data derived programmably from either the first or second address sources;

a second address unit for driving a plurality of write wordlines associated with the second portion of memory cells based on address data derived programmably from either the first or second address sources;

a plurality of data handling circuits for programmably propagating data between a plurality of bitlines associated with the first portion of memory cells and either the first or second data buses; and a programming system for providing programming information to the first and second address units and the plurality of data handling circuits.

8. A memory array having a plurality of memory cells, the memory array comprising:

first and second address sources;

first and second data buses;

an address unit for driving a plurality of write wordlines associated with at least one portion of the plurality of memory cells based on address data derived programmably from either the first or second address sources;

a plurality of data handling circuits for programmably propagating data between a plurality of bitlines associated with the at least one portion of the plurality of memory cells and either the first or second data buses; and a programming system for providing the programming information to the address unit and the plurality of data handling circuits;

the memory array further comprising a reset signal source for propagating a reset signal to the data handling circuits and the address unit such that upon receipt of a reset signal from the reset signal source:

the address unit asserts the plurality of write wordlines; and the plurality of data handling circuits provides a reset voltage level to a plurality of write bitlines of the plurality of bitlines associated with the at least one portion of the plurality of memory cells.

9. The memory array of claim 8, wherein write ports of the memory cells of a first linear arrangement of memory cells of the at least one portion of memory cells have operatively connected thereto a given write wordline of the plurality of write wordlines.

10. The memory array of claim 9, wherein the write ports of the memory cells of a second, perpendicular linear arrangement of memory cells of the at least one portion of memory cells have operatively connected thereto a given write bitline of the plurality of write bitlines.

11. The memory array of claim 10, wherein the write port of each memory cell of the at least one portion of memory cells comprises a common write port through which reset, first data bus data, and second data bus data are propagated into the memory cell.

12. A memory array having a plurality of memory cells, the memory array comprising:

first and second address sources;

first and second data buses;

an address unit for driving a plurality of write wordlines associated with at least one portion of the plurality of memory cells based on address data derived programmably from either the first or second address sources;

a plurality of data handling circuits for programmably propagating data between a plurality of bitlines associated with the at least one portion of the plurality of memory cells and either the first or second data buses; and a programming system for providing programming information to the address unit and the plurality of data handling circuits;

wherein the plurality of data handling circuits comprises:

a plurality of write circuits disposed between the first and second data buses and a plurality of write bitlines of the plurality of bitlines.

13. The memory array of claim 12, wherein each of the plurality of write circuits has connected therein a reset circuit such that upon receipt of a reset signal, each write circuit applies a reset signal level to its respective write bitline.

14. The memory array of claim 13, wherein the address unit has connected therein a reset circuit such that upon receipt of a reset signal, the address unit asserts the plurality of write wordlines.

15. The memory array of claim 14, comprising multiple portions of memory cells including the at least one portion of memory cells, each portion of memory cells comprising a memory sub-array, each memory sub-array having associated therewith:

a respective address unit; and a respective plurality of write circuits.

16. The memory array of claim 15, wherein the first address source is a functional address bus, and the second address source is an initialization address bus connected to the programming system and having a data carrying capacity adequate to address the memory cells within each sub-array of memory cells.

17. The memory array of claim 16, further comprising:

an initialization select bus connected to the programming system for selectively controlling which sub-array of the plurality of sub-arrays is addressed by the initialization address bus.

18. A memory array having a plurality of memory cells, the memory array comprising:

first and second address sources;

first and second data buses;

an address unit for driving a plurality of write wordlines associated with at least one portion of the plurality of memory cells based on address data derived programmably from either the first or second address sources;

a plurality of data handling circuits for programmably propagating data between a plurality of bitlines associated with the at leant one portion of the plurality of memory cells and either the first or second data buses; and a programming system for providing programming information to the address unit and the plurality of data handing circuits;

wherein the memory array comprises multiple portions of memory cells including the at least one portion of memory cells, each portion of memory cells comprising a memory sub-array, the first address source is a functional address bus, the second address source is an initialization address bus, the first data bus is a functional data bus, and the second data bus is an initialization data bus, and wherein the programming system comprises:

an address space recognition unit for processing an incoming bitstream provided to the memory array, the address space recognition unit for sifting the incoming bitstream for addresses associated with a predetermined memory array initialization address space;

an array select unit connected to the address space recognition unit for determining which memory sub-array to initialize and providing an indication of which memory sub-array to initialize to an initialization select bus;

an address counter unit for providing a contiguous address stream to the initialization address bus; and a memory array data port connected to the address space recognition unit and receiving initialization data from the incoming bitstream and providing the initialization data to the initialization data bus.

19. The memory array of claim 18, wherein the programming system further comprises:

an array control signal generation unit connected to the address space recognition unit for providing control information to the initialization address bus in accordance with a desired initialization function.

20. A programmable gate array having the memory array of claim 19 embedded therein, the programmable gate array having a programming system for programmable resources therein, the programming system of the programmable gate array accepting the incoming bitstream, and control signals, in association with the programming system of the memory array and programming the programmable resources therein according to said incoming bitstream, and control signals.

21. A memory array having a plurality of memory cells, the memory array comprising:

first and second address sources;

first and second data buses;

an address unit for driving a plurality of write wordlines associated with at least one portion of the plurality of memory cells based on address data derived programmably from either the first or second address sources:

a plurality of data handling circuits for programmably propagating data between a plurality of bitlines associated with the at least one portion of the plurality of memory cells and either the first or second data buses; and a programming system for providing programming information to the address unit and the plurality of data handling circuits;

wherein the programming system comprises a parity generation unit, the parity generation unit for providing a parity signal on a parity line of one of the first and second data buses.

22. The memory array of claim 21, wherein the at least one portion of the plurality of memory cells has a group of cells for holding parity information, the parity information being provided to the group of cells from the parity line by at least one of the data handling circuits via at least one of the plurality of bitlines connected thereto.

23. A programmable gate array having a memory array embedded therein, the memory array having a plurality of memory cells, the memory array comprising:

first and second address sources;

first and second data buses;

an address unit for driving a plurality of write wordlines associated with at least one portion of the plurality of memory cells based on address data derived programmably from either the first or second address sources;

a plurality of data handling circuits for programmably propagating data between a plurality of bitlines associated with the at least one portion of the plurality of memory cells and either the first or second data buses; and a programming system for providing programming information to the address unit and the plurality of data handling circuits; the programmable gate array having a programming system for programmable resources therein, the programming system of the programmable gate array accepting bitstream and control signals in association with the programming system of the memory array aid programming the programmable resources therein according to the bitstream and control signals.

24. A system for providing write access from at least two address buses and at least two data buses, and reset access, to at least one portion of a plurality of memory cells of a memory array, the memory cells of the at least one portion of memory cells each having a write port in operative relationship with at least one bitline and a wordline, the system comprising:

an address system programmable to drive the wordlines and thereby operate each write port from a selected one of the at least two address buses;

a write system programmable to provide data to the bitlines and thereby each write port from a selected one of the at least two data buses;

wherein the address system and the write system each comprises a reset circuit for asynchronously resetting each memory cell of the at least one portion of memory cells via the respective write ports thereof.

25. The system of claim 24, wherein the memory array comprises multiple portions of memory cells including the at least one portion, and wherein each portion of memory cells has associated therewith a respective address system and write system.

26. The system of claim 24, further comprising:

a read system programmable to provide data from the bitlines to a selected one of the at least two data buses.

27. The system of claim 26, wherein:

the read system is further programmable to programmably receive data from only a selected subset of the bitlines thereby providing a sub-element addressing capability for the at least one portion of memory cells.

28. The system of claim 26, wherein the memory array comprises multiple portions of memory cells including the at least one portion, and wherein each portion of memory cells has associated therewith a respective address system, write system, and read system.

29. The system of claim 24, wherein:

the write system is further programmable to programmably apply data to only a selected subset of the bitlines thereby providing a sub-element addressing capability for the at least one portion of memory cells.

30. The system of claim 24, wherein:

the write system is further programmable to programmably apply a fixed data value to a selected subset of the bitlines when applying data from a given one of the at least two data buses.

31. The system of claim 24, wherein:

one of the at least two data buses comprises a data line for carrying data which is a function of the data on at least one other line of said one of the at least two data buses, the data on the data line for application to a given subset of the at least one portion of memory cells via any bitlines associated with the given subset.

32. The system of claim 31, further comprising:

a parity generator for driving the data line of said one of the at least two data buses, the parity generator having as input the data destined for the at least one other line of said one of the at least two data buses.

33. A method for operating a programmable gate array having embedded therein an array of memory cells, the array of memory cells being accessible from the programmable gate array via functional address and data buses switchably connected to a set of wordlines and bitlines, the method comprising:

using a configuration bitstream to configure configurable resources of the programmable gate array; and using the configuration bitstream to initialize the array of memory cells via initialization address and data buses, the initialization address and data buses being switchably connected to the set of wordlines and bitlines.

34. The method of claim 33, wherein the step of using the configuration bitstream to initialize the array of memory cells includes the step of:

resolving differences between a word width of the memory array and a word width of the programmable gate array.

35. The method of claim 34 wherein the step of resolving differences includes using sub-word addressing and/or parity.

36. A system for operating a programmable gate array having embedded therein an array of memory cells, the array of memory cells being accessible from the programmable gate array via functional address and data buses switchably connected to a set of wordlines and bitlines, the system comprising:

means for using a configuration bitstream to configure configurable resources of the programmable gate array; and means for using the configuration bitstream to initialize the array of memory cells via initialization address and data buses, the initialization address and data buses being switchably connected to the set of wordlines and bitlines.

37. The system of claim 36, wherein the means for using the configuration bitstream to initialize the array of memory cells includes:

means for resolving differences between a word width of the memory array and a word with width of the programmable gate array.

38. The system of claim 37, wherein the means for resolving differences includes means for using sub-word addressing and/or parity generation.

* * * * *

UNITED STATES PATENT AND TRADEMARK OFFICE
CERTIFICATE OF CORRECTION

PATENT NO. : 5,802,003
DATED : September 1, 1998
INVENTOR(S) : Iadanza et al.

It is certified that error appears in the above-identified patent and that said Letters Patent is hereby corrected as shown below:

Claim 18, line 41, delete "leant", sutbstitute therefor --least--.

Claim 18, line 47, delete "handing", substitute therefor --handling--.

Signed and Sealed this

Sixth Day of April, 1999

Attest:

Attesting Officer

Q. TODD DICKINSON

Acting Commissioner of Patents and Trademarks

UNITED STATES PATENT AND TRADEMARK OFFICE
CERTIFICATE OF CORRECTION

PATENT NO. : 5,802,003
DATED : September 01, 1998
INVENTOR(S) : Iadanza et al.

It is certified that error appears in the above-indentified patent and that said Letters Patent is hereby corrected as shown below:

Claim 23, Col. 19, line 1, delete "aid" and substitute therefor --and--.

Signed and Sealed this

Twenty-eighth Day of September, 1999

Attest:

Q. TODD DICKINSON

*Attesting Officer*      *Acting Commissioner of Patents and Trademarks*